(12) United States Patent
Kim et al.

(10) Patent No.: US 12,369,485 B2
(45) Date of Patent: Jul. 22, 2025

(54) DISPLAY APPARATUS AND METHOD OF MANUFACTURING THE SAME

(71) Applicants: SAMSUNG DISPLAY CO., LTD., Yongin-si (KR); Korea University Research And Business Foundation, Sejong Campus, Sejong-si (KR)

(72) Inventors: Sanggab Kim, Yongin-si (KR); Munpyo Hong, Sejong-si (KR); Taesung Kim, Yongin-si (KR); Howon Yoon, Sejong-si (KR); Hyunmin Cho, Yongin-si (KR); Seongyong Kwon, Sejong-si (KR)

(73) Assignees: SAMSUNG DISPLAY CO., LTD., Gyeonggi-Do (KR); KOREA UNIVERSITY RESEARCH AND BUSINESS FOUNDATION, SEJONG CAMPUS, Sejong-si (KR)

( * ) Notice: Subject to any disclaimer, the term of this patent is extended or adjusted under 35 U.S.C. 154(b) by 771 days.

(21) Appl. No.: 17/560,953

(22) Filed: Dec. 23, 2021

(65) Prior Publication Data
US 2022/0320209 A1    Oct. 6, 2022

(30) Foreign Application Priority Data
Mar. 30, 2021    (KR) .................. 10-2021-0041263

(51) Int. Cl.
H01L 27/32    (2006.01)
H01L 51/56    (2006.01)
(Continued)

(52) U.S. Cl.
CPC ......... H10K 71/621 (2023.02); H10D 86/441 (2025.01); H10D 86/60 (2025.01);
(Continued)

(58) Field of Classification Search
CPC ........... H10K 59/131; H10K 59/80517; H10K 59/80518; H10K 50/816; H10K 50/818;
(Continued)

(56) References Cited

U.S. PATENT DOCUMENTS 7,927,497 B2    4/2011    Lim et al.
9,570,320 B2    2/2017    Shen et al.
(Continued)

FOREIGN PATENT DOCUMENTS

CN    205068358 U  *  3/2016    ........... G06F 3/0487
JP    2002-157929 A  *  5/2002    ............. B32B 15/04
(Continued)

OTHER PUBLICATIONS

Machine translation, Hong, Korean Pat. Pub. No. KR20170135507A, translation date: Aug. 6, 2024, Espacenet, all pages. (Year: 2024).*
(Continued)

*Primary Examiner* — Victoria K. Hall
(74) *Attorney, Agent, or Firm* — CANTOR COLBURN LLP

(57) ABSTRACT

A display apparatus includes: an insulating layer; and a conductive pattern arranged on the insulating layer and including a first layer and a second layer, where the first layer includes at least one selected from indium (In), stannum (Sn) and oxygen (O), the second layer includes silver (Ag), and a lateral surface of the conductive pattern defining an edge portion of the conductive pattern includes silver chloride ($AgCl_x$).

19 Claims, 27 Drawing Sheets

(51) Int. Cl.
*H10D 86/40* (2025.01)
*H10D 86/60* (2025.01)
*H10K 59/131* (2023.01)
*H10K 59/80* (2023.01)
*H10K 71/00* (2023.01)
*H10K 71/20* (2023.01)
*H10K 59/12* (2023.01)
*H10K 59/124* (2023.01)

(52) U.S. Cl.
CPC ..... *H10K 59/131* (2023.02); *H10K 59/80517* (2023.02); *H10K 59/80518* (2023.02); *H10K 71/00* (2023.02); *H10K 71/231* (2023.02); *H10K 59/1201* (2023.02); *H10K 59/124* (2023.02)

(58) Field of Classification Search
CPC .... H10K 71/60; H10K 71/621; H01L 27/124; H10D 86/441; H10D 86/60
See application file for complete search history.

(56) References Cited

U.S. PATENT DOCUMENTS

| | | | |
|---|---|---|---|
| 10,020,301 B2 | 7/2018 | Xu | |
| 10,910,232 B2 | 2/2021 | Kim et al. | |
| 11,127,807 B2 * | 9/2021 | Kim | H10K 59/8051 |
| 2007/0115081 A1* | 5/2007 | Kim | H01H 59/0009 |
| | | | 333/262 |
| 2013/0240853 A1 | 9/2013 | Cao | |
| 2020/0058727 A1* | 2/2020 | Kim | H10K 59/8051 |
| 2021/0117636 A1* | 4/2021 | Lin | G06V 40/1306 |

FOREIGN PATENT DOCUMENTS

| | | | | |
|---|---|---|---|---|
| KR | 10-2017-0135507 A | * | 12/2017 | ............ H01L 21/02 |
| KR | 101938794 B1 | | 4/2019 | |
| KR | 1020190038709 A | | 4/2019 | |

OTHER PUBLICATIONS

Machine translation, Koike, Japanese Pat. Pub. No. JP2002157929A, translation date: Aug. 6, 2024, Espacenet, all pages. (Year: 2024).*
Machine translation, Zhou, Chinese Pat. Pub. No. CN205068358U, translation date: Jan. 17, 2025, Espacenet, all pages. (Year: 2025).*
Machine translation, Hong, Korean Pat. Pub. No. 20170135507A, translation date: Mar. 16, 2025, Espacenet, all pages. (Year: 2025).*
Machine translation, Koike, Japanese Pat. Pub. No. JP 2002157929A, translation date: Mar. 16, 2025, Espacenet, all pages. (Year: 2025).*

* cited by examiner

DISPLAY APPARATUS AND METHOD OF MANUFACTURING THE SAME

This application claims priority to Korean Patent Application No. 10-2021-0041263, filed on Mar. 30, 2021, and all the benefits accruing therefrom under 35 U.S.C. § 119, the content of which in its entirety is herein incorporated by reference.

BACKGROUND

1. Field

One or more embodiments relate to a display apparatus and a method of manufacturing the same.

2. Description of the Related Art

Recently, the demands for display apparatuses having high-resolution and high-density circuits have increased. Display apparatuses may include a conductive pattern configured to prevent or reduce light loss. In such display apparatuses, the conductive pattern may include a first layer and a second layer, where the first layer includes at least one selected from indium (In), stannum (Sn) and oxygen (O), and the second layer includes silver (Ag). A wet etching process that uses an etching solution may be used to etch the first layer and the second layer.

SUMMARY

In display apparatuses including a conductive pattern including a first layer and a second layer, where the first layer includes at least one selected from indium (In), stannum (Sn) and oxygen (O), and the second layer includes silver (Ag), it may be difficult to precisely control a critical dimension ("CD") in a wet etching process that uses an etching solution, as the sizes and the resolutions of the display apparatuses increase.

One or more embodiments include a display apparatus including a conductive pattern having a high reliability and precisely arranged on an insulating layer.

One or more embodiments include a method of manufacturing a display apparatus, where a conductive layer is etched through a dry etching process having a high reliability.

According to an embodiment of the invention, a display apparatus includes an insulating layer, and a conductive pattern disposed on the insulating layer, where the conductive pattern includes a first layer and a second layer, the first layer includes at least one selected from indium (In), stannum (Sn) and oxygen (O), the second layer includes silver (Ag), and a lateral surface of the conductive pattern defining an edge portion of the conductive pattern includes silver chloride ($AgCl_x$).

In an embodiment, an upper surface of the insulating layer may include a first area and a second area, the first area may overlap the conductive pattern, the second area may extend from the first area, and the insulating layer may include a chlorine component ($Cl_x$) in the second area.

In an embodiment, the conductive pattern may be disposed directly on the insulating layer.

In an embodiment, each of the first layer and the second layer may be an dry-etched layer.

In an embodiment, the conductive pattern may include a lower surface of the conductive pattern which faces an upper surface of the insulating layer, and an angle between the lower surface of the conductive pattern and a lateral surface of the conductive pattern may be one of an acute angle and a right angle.

In an embodiment, the first layer may include indium tin oxide ("ITO").

In an embodiment, the conductive pattern may further include a third layer including at least one selected from indium (In), stannum (Sn) and oxygen (O), and the first layer, the second layer and the third layer may be sequentially stacked one on another.

In an embodiment, the display apparatus may further include an emission layer disposed on the conductive pattern, and an opposite electrode disposed on the emission layer, where the conductive pattern may include a pixel electrode.

In an embodiment, the display apparatus may further include a substrate disposed below the conductive pattern, and a thin-film transistor disposed between the substrate and the insulating layer, where the thin-film transistor may be electrically connected to the conductive pattern.

In an embodiment, the conductive pattern may include a wiring.

According to an embodiment of the invention, a method of manufacturing a display apparatus includes arranging a display substrate inside a chamber, where the display substrate includes an insulating layer and a conductive layer on the insulating layer, the conductive layer includes a first layer and a second layer, the first layer includes at least one selected from indium (In), stannum (Sn) and oxygen (O), and the second layer includes silver (Ag), supplying a gas into the chamber, where the gas includes hydrogen and hydrogen chloride, and etching the conductive layer by allowing the conductive layer to react with the gas.

In an embodiment, a ratio of a flux of the hydrogen to a flux of the gas may be about 0.17 or greater.

In an embodiment, a ratio of a flux of the hydrogen to a flux of the gas may be about 0.5 or less.

In an embodiment, the chamber may be connected to a plasma generator, the etching of the conductive layer may be performed by using plasma formed by the plasma generator, the plasma generator may include an electron cyclotron resonance plasma generator, and the display substrate may be apart from the plasma generator by about 3 centimeters (cm) or less.

In an embodiment, the conductive layer may be etched with reactive ions.

In an embodiment, the etching the conductive layer may include forming silver hydride ($AgH_x$).

In an embodiment, the conductive layer may further include a third layer including at least one selected from indium (In), stannum (Sn) and oxygen (O), the first layer, the second and the third layer may be sequentially stacked one on another, and the first layer, the second and the third layer may be etched during a same process.

In an embodiment, the method may further include spectroscopically analyzing a material inside the chamber, where the etching the conductive layer may be terminated based on a result from the spectroscopically analyzing the material inside the chamber.

In an embodiment, the method may further include providing a mask on the conductive layer, where a mask opening may be defined in the mask.

In an embodiment, the method may further include maintaining a temperature of the display substrate below about 100° C.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1:
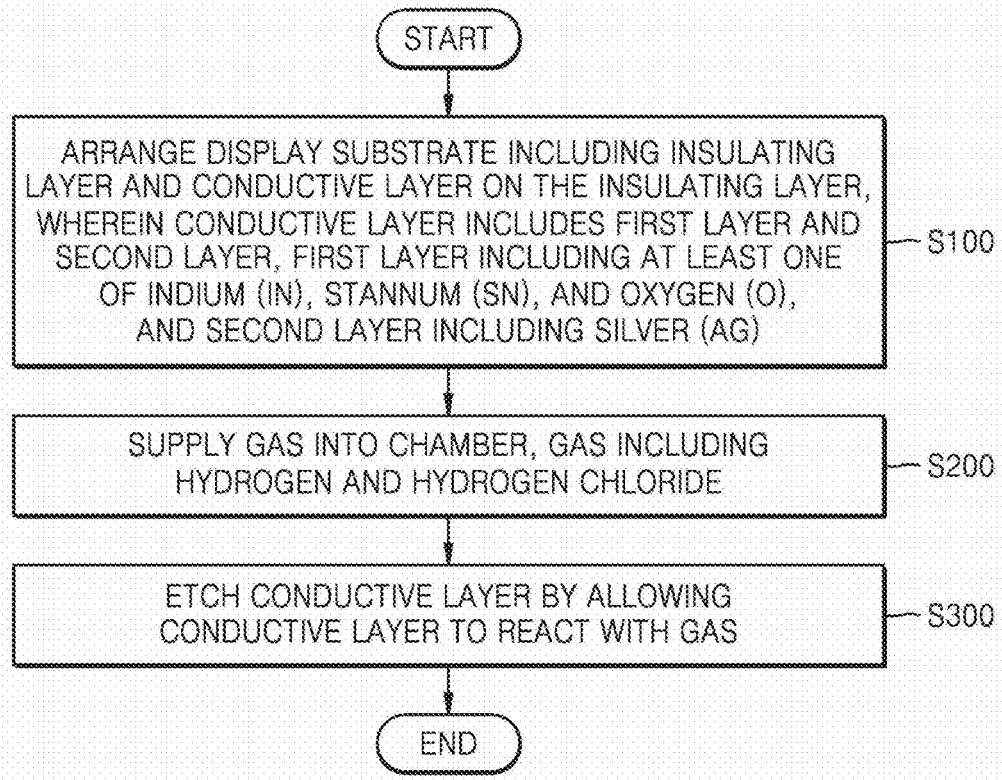
FIG. 1 is a flowchart showing a method of manufacturing a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

As the present disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Sizes of elements in the drawings may be exaggerated or reduced for convenience of explanation. For example, since sizes and thicknesses of elements in the drawings are arbitrarily illustrated for convenience of explanation, the disclosure is not limited thereto.

When an embodiment may be implemented differently, a certain process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to the other layer, region, or component with other layer, region, or component interposed therebetween.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

In embodiments of the invention, a display apparatus may include a conductive pattern including a first layer and a second layer, where the first layer includes at least one selected from indium (In), stannum (Sn), and oxygen (O), and the second layer includes silver (Ag). The conductive pattern may prevent or reduce light loss. In an embodiment, the conductive pattern may serve as a pixel electrode of the display apparatus. In an alternative embodiment, the conductive pattern may serve as a wiring of the display apparatus.

The conductive pattern may be formed by etching a conductive layer including a first layer and a second layer, where the first layer includes at least one selected from indium (In), stannum (Sn), and oxygen (O), and the second layer includes silver (Ag). To etch the conductive layer, a wet etching process or a dry etching process may be used. In a case where the conductive layer is etched through a wet etching process, it may be difficult to control a precise critical dimension ("CD"). In addition, in a conductive pattern formed after the conductive layer is wet-etched, the lateral surface of the conductive pattern defining the edge portion of the conductive pattern may have an undercut shape. In this case, the reliability of the display apparatus including the conductive pattern may be reduced.

The conductive layer may be etched through a dry etching process. The first layer including at least one selected from indium (In), stannum (Sn), and oxygen (O) may be etched by using chlorine ($Cl_2$)-based plasma. In a case where the first layer includes indium tin oxide ("ITO"), hydrogen ($H_2$) may be added. Because hydrogen ($H_2$) separates oxygen coupling by reacting with oxygen of the first layer and increases the reactivity between chlorine radicals or chlorine atoms (Cl) and indium (In) and between chlorine radicals or chlorine atoms (Cl) and stannum (Sn), an etch rate may increase.

The second layer including silver (Ag) may be dry-etched. In a case where the second layer is etched by using carbon tetrafluoride ($CF_4$)-based plasma, fluorinated silver (AgF) may be formed. Though non-volatile fluorinated silver may be removed through a process of developing a photoresist, an afterimage may be left. In a case where the second layer is etched by using chlorine ($Cl_2$)-based plasma, an undercut shape may be formed in the lateral surface of the conductive pattern. In a case where the second layer is etched by using oxygen ($O_2$)-based plasma, a photoresist may not be used as a mask. In a case where the second layer is etched by using hydrogen ($H_2$)-based plasma, silver hydride ($AgH_x$) may be formed. Silver hydride ($AgH_x$) may include AgH or $AgH_2$. Silver hydride ($AgH_x$) may include a volatile material.

Accordingly, the conductive layer including the first layer and the second layer may be etched by using a gas including chlorine ($Cl_2$) and hydrogen ($H_2$). In this case, during an operation of etching the second layer including silver (Ag), a chlorine radical or chlorine atom (Cl)-based gas is removed from the chamber, and the second layer may be etched by using a hydrogen radical or hydrogen atom (H)-based gas. However, when a multi-level etching process is used, a process of manufacturing the display apparatus may be complicated.

During a dry-etching process that uses pure hydrogen chloride (HCl)-based plasma, silver (Ag) grows into silver chloride ($AgCl_x$). Silver chloride ($AgCl_x$) that has grown once may not be removed even under hydrogen ($H_2$)-based plasma. Accordingly, forming of silver chloride ($AgCl_x$) due to chlorine radicals or chlorine atoms (Cl) is desired to be blocked in the beginning of the reaction.

FIG. 1 is a flowchart showing a method of manufacturing a display apparatus according to an embodiment.

Referring to FIG. 1, an embodiment of a method of manufacturing a display apparatus according to the invention may include arranging a display substrate into a chamber (S100), where the display substrate includes an insulating layer and a conductive layer on the insulating layer, the conductive layer includes a first layer and a second layer, the first layer includes at least one selected from indium (In), stannum (Sn), and oxygen (O), and the second layer includes silver (Ag), supplying a gas into the chamber (S200), where the gas includes hydrogen and hydrogen chloride, and etching the conductive layer by allowing the conductive layer to react with the gas (S300). Accordingly, the conductive layer may be etched with high reliability through a simplified process. Hereinafter, embodiments of an apparatus for manufacturing a display apparatus, in which the conductive layer is etched with high reliability through the above process, and embodiments of a method of manufacturing a display apparatus will be described in detail.

Figure 2:
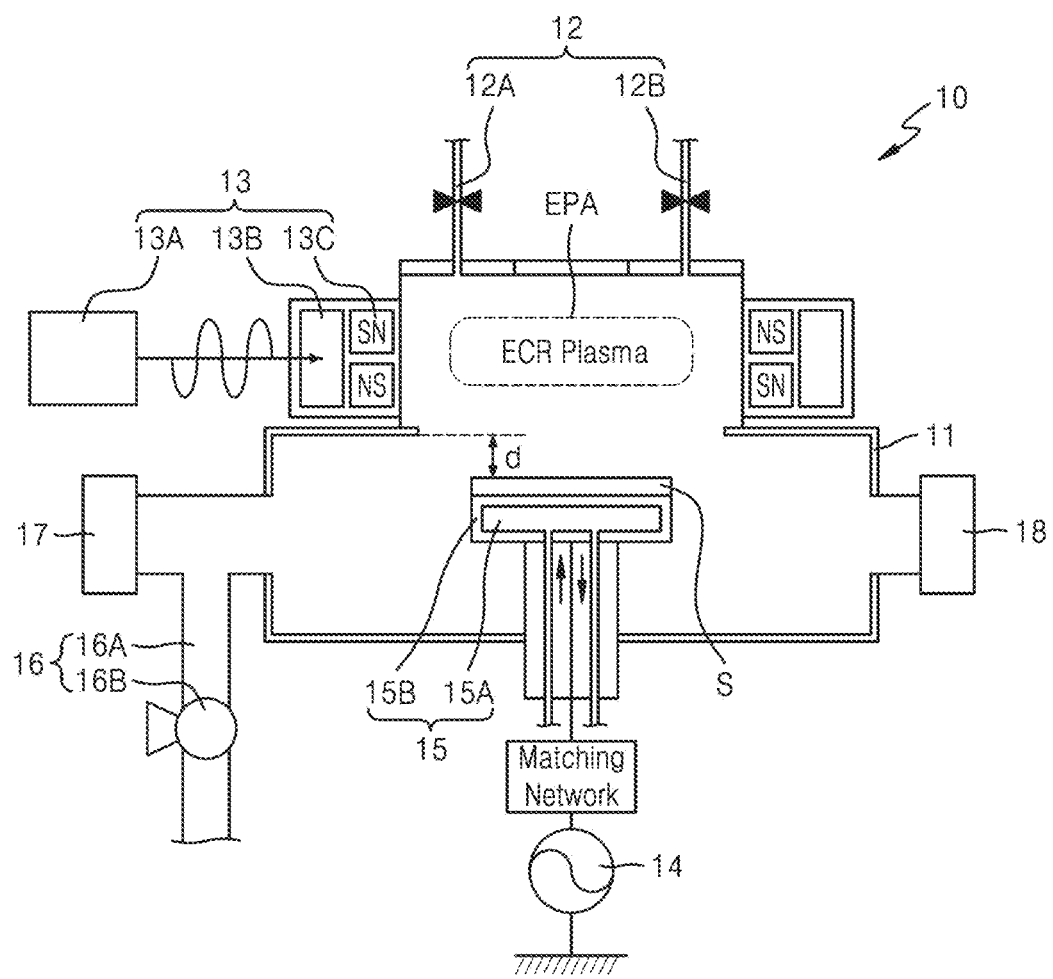
FIG. 2 is a view of an apparatus for manufacturing a display apparatus according to an embodiment.

FIG. 2 is a view of an apparatus 10 for manufacturing a display apparatus according to an embodiment. FIGS. 3A to 3E are cross-sectional views showing a method of manufacturing a display apparatus according to an embodiment. FIG. 4 is a view showing an image of a conductive pattern CDP formed by a method of manufacturing a display apparatus according to an embodiment.

Referring to FIG. 2, an embodiment of the apparatus 10 for manufacturing a display apparatus may include a chamber 11, a pipe 12, a plasma generator 13, a radio frequency ("RF") generator 14, a susceptor 15, a pressure adjustor 16, a mass spectrometer 17, and a spectroscopic analyzer 18. The chamber 11 may be a process chamber. The chamber 11 may be connected to the pipe 12, the plasma generator 13, the pressure adjustor 16, the mass spectrometer 17, and the spectroscopic analyzer 18.

The pipe 12 may supply a gas into the chamber 11. In an embodiment, a valve may be provided to or disposed in the pipe 12. In an embodiment, the pipe 12 may include a first pipe 12A and a second pipe 12B. In an embodiment, hydrogen ($H_2$) may be supplied into the chamber 11 through the first pipe 12A. Hydrogen chloride (HCl) may be supplied into the chamber 11 through the second pipe 12B. In an embodiment, argon (Ar) and hydrogen chloride (HCl) may be supplied into the chamber 11 through the second pipe 12B. The hydrogen ($H_2$) supplied through the first pipe 12A and the argon (Ar) and the hydrogen chloride (HCl) supplied through the second pipe 12B may constitute a gas introduced into the chamber 11.

The plasma generator 13 may be disposed or arranged on the chamber 11. In an embodiment, the plasma generator 13 may linearly move in the chamber 11. In such an embodiment, a driver (not shown) may be connected to the plasma generator 13. In one embodiment, for example, the driver may include a belt, a chain, or a cylinder. In such an embodiment, the apparatus 10 for manufacturing a display apparatus may be configured to manufacture a large-sized display apparatus. In an embodiment, the susceptor 15 may linearly move with respect to the plasma generator 13. In such an embodiment, the apparatus 10 for manufacturing a display apparatus may be configured to manufacture a large-sized display apparatus.

In an embodiment, the plasma generator 13 may include long sides and short sides. In one embodiment, for example, the plasma generator 13 may have an elliptical shape having a long axis and a short axis. In such an embodiment, the plasma generator 13 may be effectively used for a large-sized display substrate S by increasing the size of the plasma generator 13 in the long-axis direction. In an embodiment, the plasma generator 13 may be provided in a plural and a plurality of plasma generators 13 may be arranged in the short-axis direction. In such an embodiment, the plurality of plasma generators 13 may be effectively used for a large-sized display substrate S. In an alternative embodiment, the apparatus 10 for manufacturing a display apparatus may include a single plasma generator 13.

The plasma generator 13 may include an electron cyclotron resonance ("ECR") plasma generator. The ECR plasma generator may generate high-density plasma having a high plasma electron temperature by using an electric field and a magnetic field simultaneously. The plasma generator 13 may include an electromagnetic wave oscillator 13A, a resonator 13B, and a magnet 13C.

The electromagnetic wave oscillator 13A may allow electromagnetic waves to oscillate to the resonator 13B and/or the magnet 13C. In an embodiment, the electromagnetic waves may include microwaves having a frequency of about 2.45 gigahertz (GHz). The resonator 13B may surround the magnet 13C. The resonator 13B may guide the electromagnetic waves. The magnet 13C may generate a magnetic field. In an embodiment, the magnet 13C may be provided in a plural, and the plurality of magnets 13C may be arranged along the inner peripheral surface of the resonator 13B. In an embodiment, the magnet 13C may be arranged in a long track shape.

With a magnetic field formed inside the chamber 11, when electromagnetic waves oscillated by the electromagnetic wave oscillator 13A are input into the chamber 11, the rotational frequency of electrons due to the magnetic field coincides with the frequency of the electromagnetic waves, and thus, electron cyclotron resonance may occur. A region in which electron cyclotron resonance occurs may be called an ECR area EPA. Accordingly, in such an embodiment, when a gas is injected to the ECR area EPA, the gas is ionized, plasma is formed, and electrons inside the plasma are accelerated due to resonance to obtain large energy while passing through the ECR area EPA. In such an embodiment, because diffusion loss is reduced due to the magnetic field and an ionization rate of the gas increases, high-density plasma having a high plasma electron temperature may be generated.

In an embodiment where the plasma generator 13 is an ECR plasma generator, the plasma generator 13 has higher-density plasma having, for example, $10^{11}$ per cubic centimeter ($/cm^3$) or greater and has higher energy having, for example, in a range of about 1 electronvolt (eV) to about 10 eV than an inductively coupled plasma ("ICP") source or a capacitively coupled plasma ("CCP") source. Accordingly, it may be desired in an aspect of a process. Particularly, because hydrogen ($H_2$) has a high energy coupling of about 4.52 eV at a room temperature, an electron cyclotron resonance plasma generator may be desired to form hydrogen radicals.

The RF generator 14 may apply radio frequencies to the susceptor 15. In an embodiment, the apparatus 10 for manufacturing a display apparatus may further include an electrode facing the susceptor 15. Accordingly, a reactive ion etching ("RIE") process may be performed inside the chamber 11, and an etching process performed inside the chamber 11 may be an anisotropic etching.

The susceptor 15 may be arranged inside the chamber 11. The susceptor 15 may support the display substrate S. In an embodiment, the susceptor 15 may linearly move. In one embodiment, for example, the susceptor 15 may move in a direction toward the plasma generator 13. The susceptor 15 may ascend or descend. In one alternative embodiment, for example, the susceptor 15 may horizontally move in a direction in which the plurality of magnets 13C arranged on two opposite sides are apart from each other. In such an embodiment, the susceptor 15 may be connected to a driver (not shown) to linearly move. In an embodiment, the driver may include a belt, a chain, or a cylinder, for example.

The susceptor 15 may include a cooler 15A and a temperature measuring unit 15B. In an embodiment, the cooler 15A may include a flow path. In such an embodiment, the cooler 15A may cool down the display substrate S by using coolant (e.g., water). In an embodiment, the cooler 15A may maintain the display substrate S below 100° C. The temperature measuring unit 15B may measure the temperature of the display substrate S. In an embodiment, the temperature measuring unit 15B may be a thermocouple.

The display substrate S may be a display apparatus that is being manufactured. The display substrate S may be provided or arranged on the susceptor 15. In an embodiment, a robot arm (not shown) may be configured to arrange the display substrate S to the susceptor 15. The display substrate S may include glass or a polymer resin including at least one selected from polyethersulfone, polyarylate, polyetherimide, polyethylene naphthalate, polyethylene terephthalate, polyphenylene sulfide, polyimide, polycarbonate, cellulose tri acetate, and cellulose acetate propionate.

The display substrate S may be apart from the plasma generator 13. The display substrate S may be apart from the plasma generator 13 by a separation distance d. The separation distance d may be a shortest distance in a direction toward the plasma generator 13 from the display substrate S. In an embodiment, the separation distance d may be about 10 centimeters (cm) or less. In an embodiment, the separation distance d may be about 3 cm or less.

The pressure adjustor 16 may be connected to the chamber 11. The pressure adjustor 16 may include a connection pipe 16A and a pump 16B, where the connection pipe 16A is connected to the chamber 11, and the pump 16B is installed on the connection pipe 16A. External air may be introduced through the connection pipe 16A based on an operation of the pump 16B. Alternatively, a gas inside the chamber 11 may be guided to the outside through the connection pipe 16A. In an embodiment, the pressure adjustor 16 may adjust the inner pressure of the chamber 11 to be below 30 mTorr. In an embodiment, the pressure adjustor 16 may adjust the inner pressure of the chamber 11 to be similar to atmospheric pressure.

The mass spectrometer 17 may analyze the mass of a material inside the chamber 11. In an embodiment, the mass spectrometer 17 may analyze a product in the etching process. In an embodiment, the mass spectrometer 17 may include a quadruple mass spectrometer ("QMS"). The QMS may separate a mass by using a high frequency quadruple electric field.

The spectroscopic analyzer 18 may analyze a material inside the chamber 11 by using an optical apparatus. The spectroscopic analyzer 18 may spectroscopically analyze a material inside the chamber 11. In an embodiment, the spectroscopic analyzer 18 may spectroscopically analyze a material inside the chamber 11 in real-time during an etching process. In an embodiment, a reaction of etching the conductive layer of the display substrate S may be terminated based on the spectroscopic analysis results. In an embodiment, the spectroscopic analyzer 18 may include an optical emission spectrometer ("OES"). The spectroscopic analyzer 18 may analyze a compound including at least one selected from indium (In), stannum (Sn), silver (Ag), chlorine (Cl), and hydrogen (H). In an alternative embodiment, at least one selected from the mass spectrometer 17 and the spectroscopic analyzer 18 may be omitted.

In an embodiment, the conductive layer of the display substrate S may be etched through a dry-etching process simplified and having a high reliability by using the apparatus 10 for manufacturing a display apparatus. Hereinafter, an embodiment of a method of manufacturing a display apparatus will be described in greater detail with reference to FIGS. 2, 3A to 3E.

Figure 3A:
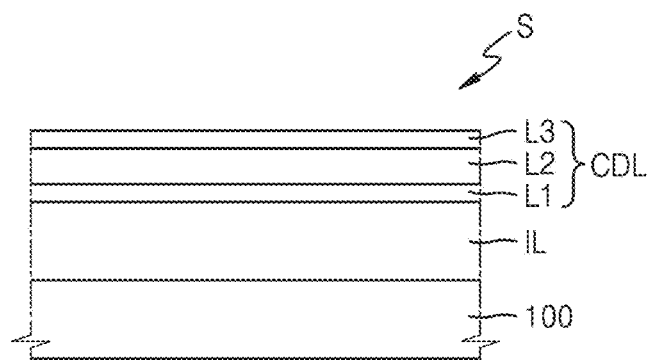
FIGS. 3A to 3E are cross-sectional views showing a method of manufacturing a display apparatus according to an embodiment.
Figure 4:
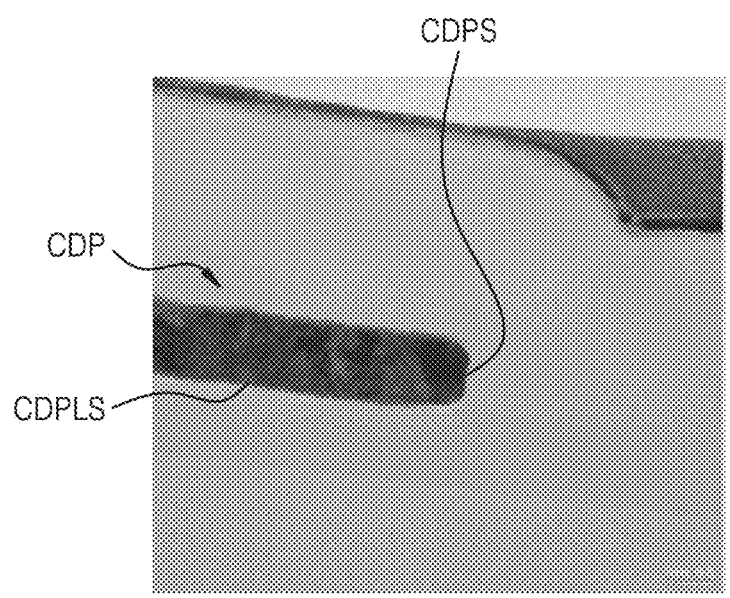
FIG. 4 is a view showing an image of a conductive pattern formed by a method of manufacturing a display apparatus according to an embodiment.

Referring to FIGS. 2 and 3A, the display substrate S may be provided or arranged inside the chamber 11. In an embodiment, the display substrate S may be arranged inside the chamber 11 by using a robot arm (not shown). The display substrate S may be provided or arranged on the susceptor 15.

In an embodiment, as shown in FIG. 3A, the display substrate S may include the substrate 100, an insulating layer IL, and a conductive layer CDL. The substrate 100 may include glass or a polymer resin including at least one selected from polyethersulfone, polyarylate, polyetherimide, polyethylene naphthalate, polyethylene terephthalate, polyphenylene sulfide, polyimide, polycarbonate, cellulose tri acetate, and cellulose acetate propionate.

The insulating layer IL may be disposed or arranged on the substrate 100. The insulating layer IL may include an inorganic material or an organic material.

The conductive layer CDL may be disposed or arranged on the insulating layer IL. In an embodiment, the conductive layer CDL may be disposed directly on the insulating layer IL. In an embodiment, the conductive layer CDL may include a first layer L1 and a second layer L2. In such an embodiment, the conductive layer CDL may further include a third layer L3.

The first layer L1 may include at least one selected from indium (In), stannum (Sn), and oxygen (O). In an embodiment, the first layer L1 may include ITO. In an embodiment, the first layer L1 may include a conductive oxide. The first layer L1 may include at least one selected from ITO, indium zinc oxide ("IZO"), zinc oxide (ZnO), indium oxide ($In_2O_3$), indium gallium oxide ("IGO"), and aluminum zinc oxide ("AZO").

The second layer L2 may be disposed or arranged on the first layer L1. The second layer L2 may include silver (Ag).

The third layer L3 may be disposed or arranged on the second layer L2. The third layer L3 may include at least one selected from indium (In), stannum (Sn), and oxygen (O). In an embodiment, the third layer L3 may include ITO. In an embodiment, the third layer L3 may include a conductive oxide. The third layer L3 may include at least one selected from ITO, IZO, zinc oxide (ZnO), indium oxide ($In_2O_3$), IGO, and AZO.

Figure 3B:
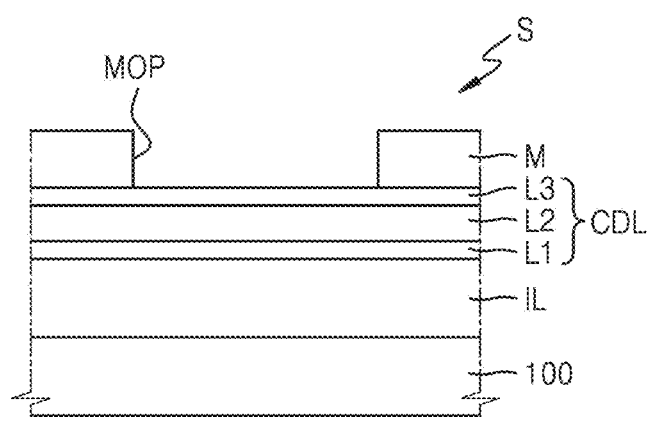

Referring to FIGS. 2 and 3B, a mask M may be provided or arranged on the conductive layer CDL, where the mask M include a mask opening MOP. The mask opening MOP may expose at least a portion of the conductive layer CDL. The mask opening MOP may define a region of the conductive layer CDL that is to be etched. In an embodiment, the mask M may include a photoresist. In an alternative embodiment, the mask M may be a hard mask including metal and silicon oxide.

Figure 3C:
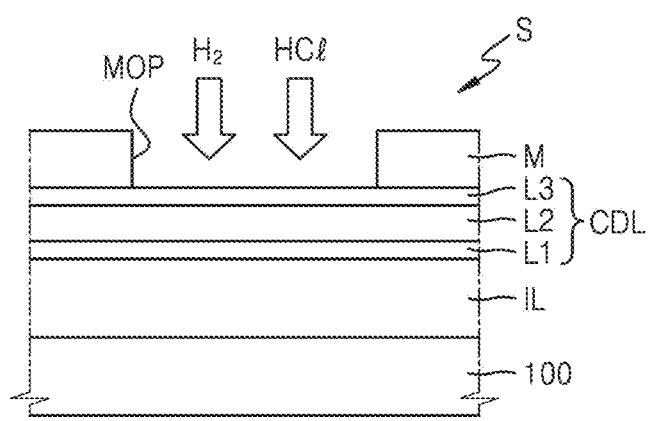

Referring to FIGS. 2 and 3C, a gas including hydrogen ($H_2$) and hydrogen chloride (HCl) may be supplied into the chamber 11. In an embodiment, a ratio of a flux of hydrogen ($H_2$) to a flux of the gas may be about 0.17 or greater. The flux of the gas may include hydrogen ($H_2$) and hydrogen chloride (HCl) and be a flux of a total gas introduced into the chamber 11. In a case where a ratio of the flux of hydrogen ($H_2$) to the flux of the gas is less than 0.17, silver chloride ($AgCl_x$) may grow. In a case where a ratio of the flux of hydrogen ($H_2$) to the flux of the gas is greater than 0.17, the forming of silver chloride (AgCl) may be reduced and silver hydride ($AgH_x$) may be formed. Accordingly, in such an embodiment, the conductive layer CDL may be etched. In an embodiment, a ratio of a flux of hydrogen ($H_2$) to a flux of the gas may be about 0.5 or less. In a case where a ratio of the flux of hydrogen ($H_2$) to the flux of the gas is greater than 0.5, an etch rate of the second layer L2 may be greater than an etch rate of the first layer L1 and/or an etch rate of the first layer L3. If an etch rate of the second layer L2 may be four or more times greater than an etch rate of the first layer L1 and/or an etch rate of the third layer L3, the lateral surface of the etched conductive layer CDL may have an undercut shape and the reliability of the display apparatus that is manufactured may be reduced. In an embodiment, a ratio of a flux of hydrogen ($H_2$) to a flux of the gas may be in a range of about 0.17 to about 0.5.

In an embodiment, the gas may be supplied at pressure of about 30 millitorr (mTorr) or less. In an embodiment, the inner pressure of the chamber 11 may be about 30 mTorr or less. In one embodiment, for example, the pressure adjustor 16 may adjust the inner pressure of the chamber 11.

Figure 3D:
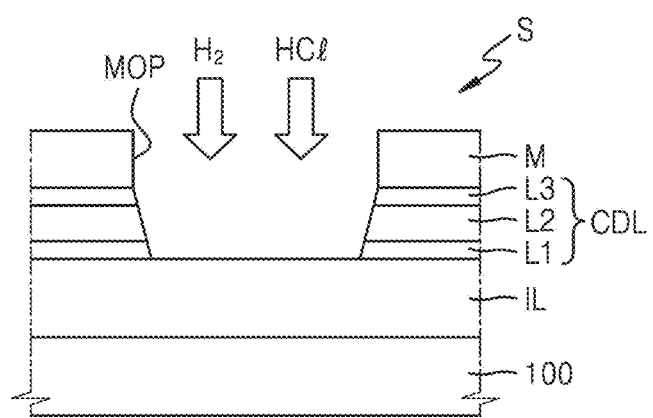

Referring to FIGS. 2 and 3D, the conductive layer CDL may be etched by allowing the conductive layer CDL to react with the gas. In an embodiment, an operation of etching the conductive layer CDL may be performed by using plasma formed by the plasma generator 13. In an embodiment, the plasma generator 13 may be an electron cyclotron resonance plasma generator. In an embodiment, the plasma generator 13 may operate at power of about 900 watts (W), the RF generator 14 may operate at power of about 300 W, the flux of the gas may be about 60 standard cubic centimeters per minute (sccm), and the inner pressure of the chamber 11 may be about 5 mTorr, but not being limited thereto. In an embodiment, the power of the plasma generator 13, the power of the RF generator 14, the flux of the gas, and the inner pressure of the chamber 11 may be variously modified or changed.

In an embodiment, the first layer L1, the second layer L2, and the third layer L3 may be etched during a same process. In such an embodiment, the gas including hydrogen ($H_2$) and hydrogen chloride (HCl) may react with the first layer L1, the second layer L2, and the third layer L3. Accordingly, in such an embodiment, a process of etching the conductive layer CDL may be simplified by using the gas including hydrogen ($H_2$) and hydrogen chloride (HCl).

The display substrate S may be apart from the plasma generator 13 by about 10 cm or less. In an embodiment, the display substrate S may be apart from the plasma generator 13 by about 3 cm or less. If a separation distance d is greater than about 3 cm, silver chloride ($AgCl_x$) may grow due to chlorine radicals or chloride atom (Cl) and an etch rate of the second layer L2 may be reduced.

The conductive layer CDL may be etched by reactive ion etching ("RIE"). In an embodiment, where the RF generator 14 applies RF to the susceptor 15, the conductive layer CDL may be etched by RIE. Accordingly, the conductive layer CDL may be anisotropically etched.

In an embodiment, the gas may react with the conductive layer CDL by applying an electric field, and volatile by-products may be formed. In an embodiment, during an operation of etching the conductive layer CDL, silver hydride ($AgH_x$) may be formed. Because silver hydride ($AgH_x$) is a volatile material, at least a portion of the conductive layer CDL may be removed. In an embodiment, an operation of supplying the gas and an operation of forming the volatile by-products may be repeated until the conductive layer CDL is etched.

In an embodiment, the etching process may be stopped at a point at which the insulating layer IL starts to be etched. In one embodiment, for example, the apparatus 10 for manufacturing a display apparatus may be configured to stop the etching process at a point at which the insulating layer IL starts to be etched. Alternatively, the etching process may be stopped at a point at which the insulating layer IL starts to be exposed.

In an embodiment, a material inside the chamber 11 may be spectroscopically analyzed. In an embodiment, the spectroscopic analyzer 18 may spectroscopically analyze the material inside the chamber 11. In an embodiment, the spectroscopic analyzer 18 may spectroscopically analyze the material inside the chamber 11 in real-time during the etching process. In an embodiment, a reaction of etching the conductive layer of the display substrate S may be terminated based on the spectroscopic analysis results. In one embodiment, for example, the spectroscopic analyzer 18 may analyze a compound including at least one selected from indium (In), stannum (Sn), silver (Ag), chlorine (Cl), and hydrogen (H). The apparatus 10 for manufacturing a display apparatus may terminate the etching process when distribution of materials inside the chamber 11 coincides with distribution of materials set in advance.

Figure 3E:
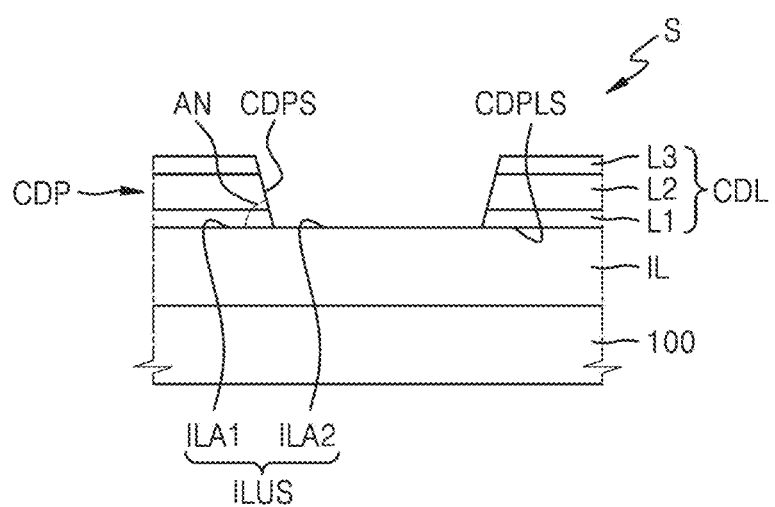

Referring to FIG. 3E, the mask M may be removed. In an embodiment, where the mask M includes a photoresist, the mask M may be removed through a developing process.

The conductive pattern CDP may be formed by removing at least a portion of the conductive layer CDL. The conductive pattern CDP may be disposed or arranged on the insulating layer IL. In an embodiment, the conductive pattern CDP may be disposed or arranged directly on the insulating layer IL. In an embodiment, the conductive pattern CDP may include the first layer L1 and the second layer L2. In an embodiment, the conductive pattern CDP may include the first layer L1, the second layer L2, and the third layer L3. The first layer L1, the second layer L2, and the third layer L3 may be sequentially stacked one on another.

A lateral surface CDPS of the conductive pattern CDP may define the edge portion of the conductive pattern CDP. The lateral surface CDPS of the conductive pattern CDP may be connected to a lower surface CDPLS of the conductive pattern CDP that faces an upper surface ILUS of the insulating layer IL. The lateral surface CDPS of the conductive pattern CDP may be a surface formed while the conductive layer CDL is etched.

The lateral surface CDPS of the conductive pattern CDP may include silver chloride ($AgCl_x$). The lateral surface CDPS of the conductive pattern CDP may include silver chloride ($AgCl_x$) while the conductive layer CDL is dry-etched. In an embodiment where the conductive layer CDL is dry-etched, the shape of the conductive pattern CDP may be more precisely controlled than a case where the conductive layer CDL is wet-etched.

In an embodiment, an angle AN between the lower surface CDPLS of the conductive pattern CDP and the lateral surface CDPS of the conductive pattern CDP may be one of an acute angle and a right angle. If the angle AN between the lower surface CDPLS of the conductive pattern CDP and the lateral surface CDPS of the conductive pattern CDP is an obtuse angle, the lateral surface CDPS of the conductive pattern CDP may have an undercut shape. In this case, the reliability of the display apparatus may be reduced. In an embodiment, because the conductive layer CDL is dry-etched, the angle AN between the lower surface CDPLS of the conductive pattern CDP and the lateral surface CDPS of the conductive pattern CDP may be one of an acute angle and a right angle, such that the reliability of the display apparatus may be improved.

The upper surface ILUS of the insulating layer IL may include a first area ILA1 and a second area ILA2. The first area ILA1 may overlap the conductive pattern CDP. The second area ILA2 may extend from the first area ILA1. The second area ILA2 may not overlap the conductive pattern CDP. In an embodiment, the second area ILA2 may a region through which the conductive layer CDL is etched and exposed.

The second area ILA2 of the insulating layer IL may include a chlorine component ($Cl_x$). In such an embodiment, the upper surface ILUS in the second area ILA2 of the insulating layer IL may include a compound including chlorine component ($Cl_x$).

In an embodiment, the temperature of the display substrate S may be maintained below about 100° C. during the above process. In an embodiment, the cooler 15A may maintain the temperature of the display substrate S below about 100° C. If a region of the chamber 11 is configured to maintain a high temperature, non-volatile by-products, for example, silver chloride ($AgCl_x$) that occurs during an operation of etching the conductive layer CDL, may partially evaporate. A portion of silver chloride ($AgCl_x$) that has evaporated may be re-deposited inside the chamber 11, and thus, the inside of the chamber 11 may be contaminated. In an embodiment, because the cooler 15A may maintain the temperature of the display substrate S below about 100° C., the evaporation of the non-volatile by-products may be effectively prevented or substantially reduced. In an embodiment, the spectroscopic analyzer 18 may measure the evaporation of the non-volatile by-products.

Referring to FIG. 4, an embodiment of the conductive pattern CDP formed by the method for manufacturing a display apparatus may include the lateral surface CDPS of the conductive pattern CDP defining the edge portion of the conductive pattern CDP. Because the conductive pattern CDP is formed through a dry-etching process, the lower surface CDPLS of the conductive pattern CDP and the lateral surface CDPS of the conductive pattern CDP may substantially constitute a right angle. In such an embodiment, an undercut shape may not be provided to the shape of the lateral surface CDPS of the conductive pattern CDP. Accordingly, the reliability of the display apparatus including the conductive pattern CDP may increase.

Figure 5:
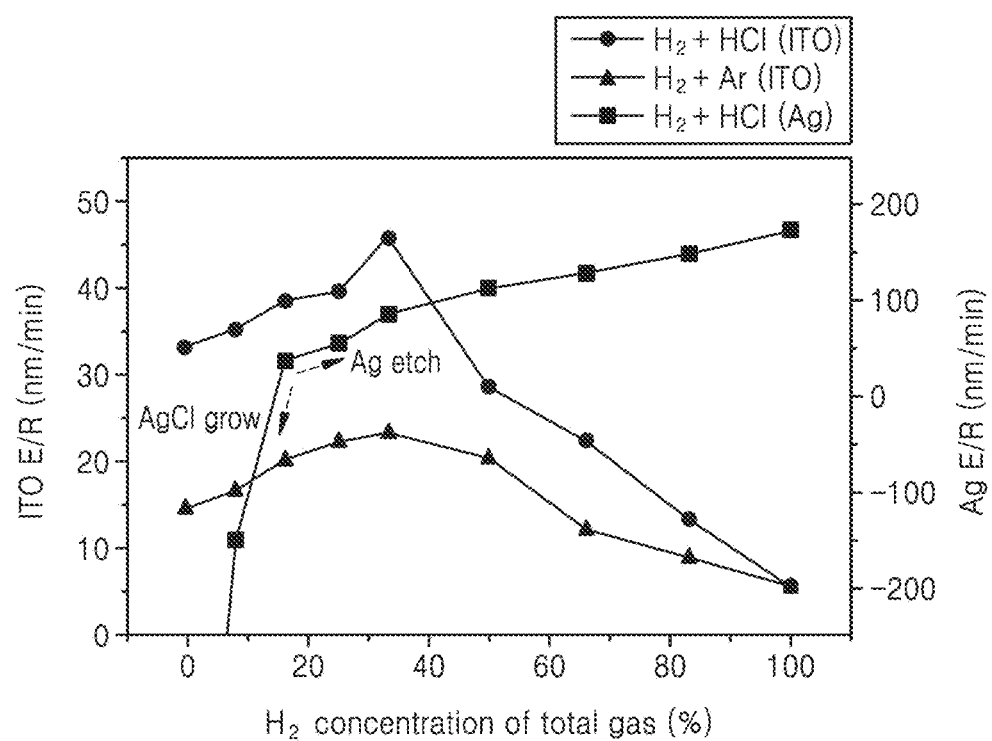
FIG. 5 is a graph showing an etch rate of silver (Ag) and an etch rate of indium tin oxide ("ITO") according to a ratio of a flux of hydrogen ($H_2$) to a flux of a gas.

FIG. 5 is a graph showing an etch rate of silver (Ag) and an etch rate of ITO according to a ratio of a flux of hydrogen ($H_2$) to a flux of a gas. The graph of FIG. 5 shows an etch rate of silver (Ag) and an etch rate of ITO in a case where the plasma generator 13 (see FIG. 2) operates at power of about 900 W, the RF generator 14 (see FIG. 2) operates at power of about 300 W, the flux of the gas is about 60 sccm, and the inner pressure of the chamber 11 (see FIG. 2) is about 5 mTorr. The flux of the gas may include hydrogen ($H_2$) and hydrogen chloride (HCl) and be a flux of a total gas introduced into the chamber 11.

Referring to FIG. 5, when a ratio of the flux of hydrogen ($H_2$) to the flux of the gas including hydrogen ($H_2$) and hydrogen chloride (HCl) is about 0.17 or greater, or the concentration of hydrogen ($H_2$) in the total gas is about 17% or greater, silver chloride (AgClx) does not grow and silver hydride ($AgH_x$) may be formed while silver (Ag) is etched. An etch rate of silver (Ag) may increase when a ratio of the flux of hydrogen ($H_2$) to the flux of the gas increases.

An etch rate of ITO may increase when a ratio of the flux of hydrogen ($H_2$) to the flux of the gas is in a range of about 0 to about 0.3, and be reduced when a ratio of the flux of hydrogen ($H_2$) to the flux of the gas is about 0.3 or greater. Indium (In) compounds of ITO may react with chlorine radicals or chlorine atoms (Cl) to be etched while forming volatile indium chlorides ($InCl_x$). Stannum (Sn) compounds may react with hydrogen radicals or hydrogen atoms (H), and/or chorine radicals or chlorine atoms (Cl) to be etched while forming tin hydrides (SnH) and/or tin chloride hydrides ($SnCl_4(5H_2)$). Oxygen (O) compounds may react with hydrogen radicals or hydrogen atoms (H) to be etched while forming water ($H_2O$) and/or hydroxyl groups.

When a ratio of the flux of hydrogen ($H_2$) to the flux of the gas including hydrogen ($H_2$) and hydrogen chloride (HCl) is about 0.5 or greater, or the concentration of hydrogen ($H_2$) in the total gas is about 50% or greater, an etch rate of silver (Ag) may be greater than an etch rate of ITO. In one embodiment, for example, an etch rate of silver (Ag) may be four times greater than an etch rate of ITO. In this case, silver (Ag) may be more etched than ITO. In an embodiment, the conductive pattern may include a first layer, a second layer, and a third layer, where the first layer includes ITO, the second layer includes Ag, and the third layer includes ITO. The first layer, the second layer, and the third layer may be sequentially stacked one on another. If Ag is more etched than ITO, the conductive pattern may have an undercut shape and the reliability of the display apparatus including the conductive pattern may be reduced. When a ratio of the flux of hydrogen ($H_2$) to the flux of the gas is maintained below about 0.5, an etch rate of Ag may be maintained similar to an etch rate of ITO, and thus, the lateral surface of the conductive pattern may be effectively prevented from having an undercut shape.

Figure 6A:
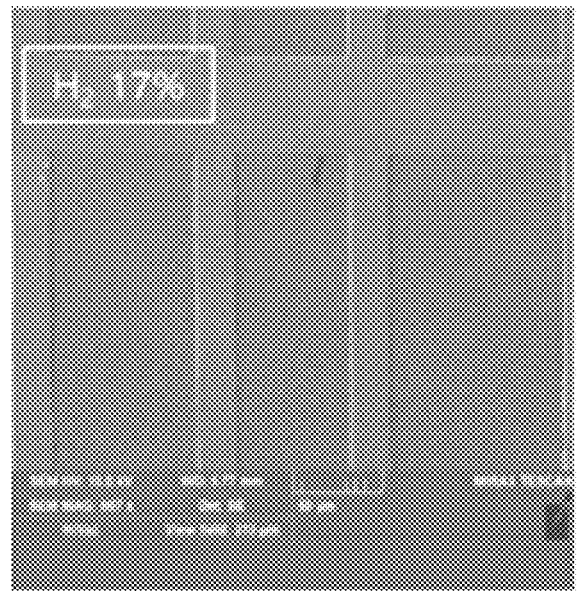
FIG. 6A is a view showing a scanning electron microscope ("SEM") planar image representing a conductive pattern formed when a conductive layer is dry-etched in a case where a ratio of a flux of hydrogen ($H_2$) to a flux of a gas is about 0.17.
Figure 6B:
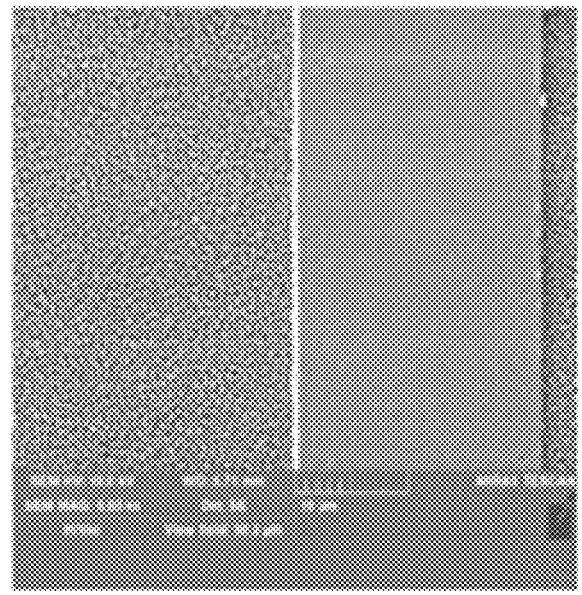
FIG. 6B is an enlarged view of a portion of FIG. 6A.
Figure 6C:
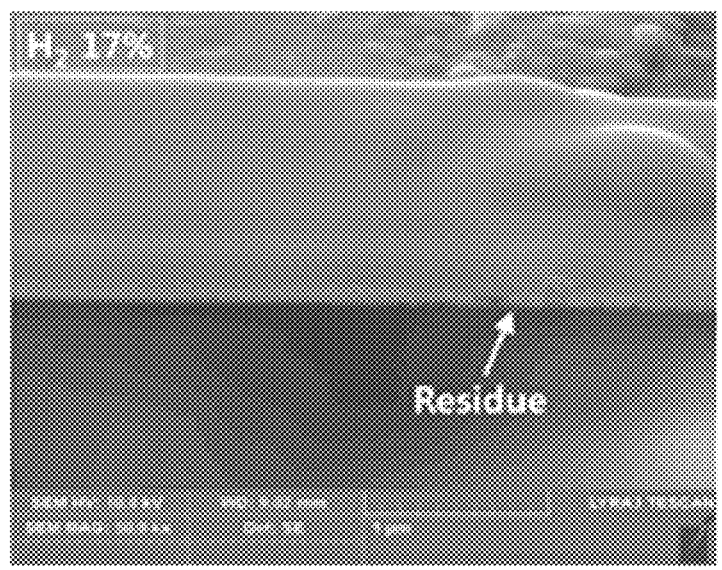
FIG. 6C is a view of an SEM cross-sectional image representing a conductive pattern formed when a conductive layer is dry-etched in a case where a ratio of a flux of hydrogen ($H_2$) to a flux of a gas is about 0.17.

FIG. 6A is a view showing a scanning electron microscope ("SEM") planar image representing a conductive pattern formed when a conductive layer is dry-etched in a case where a ratio of a flux of hydrogen ($H_2$) to a flux of a gas is about 0.17. FIG. 6B is an enlarged view of a portion of FIG. 6A. FIG. 6C is a view of an SEM cross-sectional image representing a conductive pattern formed when a conductive layer is dry-etched in the case where a ratio of a flux of hydrogen ($H_2$) to a flux of a gas is about 0.17. FIGS. 6A to 6C show SEM images representing a conductive pattern formed through the apparatus 10 for manufacturing a display apparatus of FIG. 2. In FIGS. 6A to 6C, the conductive pattern may include a first layer, a second layer, and a third layer, where the first layer includes ITO, the second layer includes Ag, and the third layer includes ITO.

Referring to FIGS. 6A to 6C, when a ratio of the flux of hydrogen ($H_2$) to the flux of the gas is about 0.17, or the concentration of hydrogen ($H_2$) in the total gas is about 17%, it is shown that, when the conductive layer is etched and a conductive pattern is formed, residual materials are left. Accordingly, silver chloride ($AgCl_x$) has grown as the residual material, and the edge portion of the conductive pattern is rough.

Figure 7A:
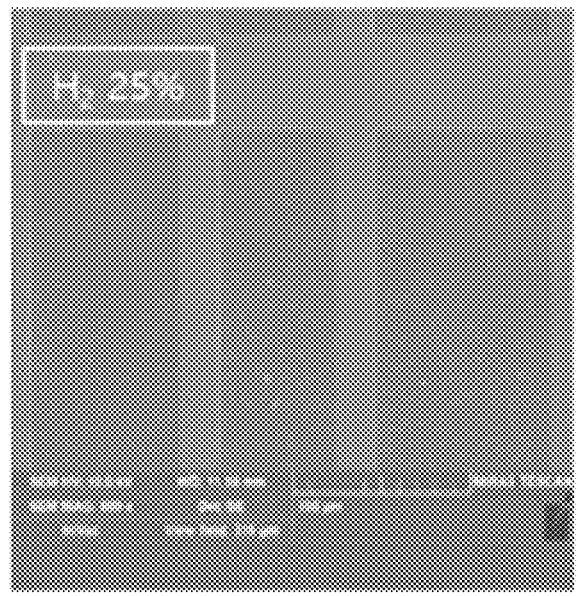
FIG. 7A is a view showing an SEM planar image representing a conductive pattern formed when a conductive layer is dry-etched in a case where a ratio of a flux of hydrogen ($H_2$) to a flux of a gas is about 0.25.
Figure 7B:
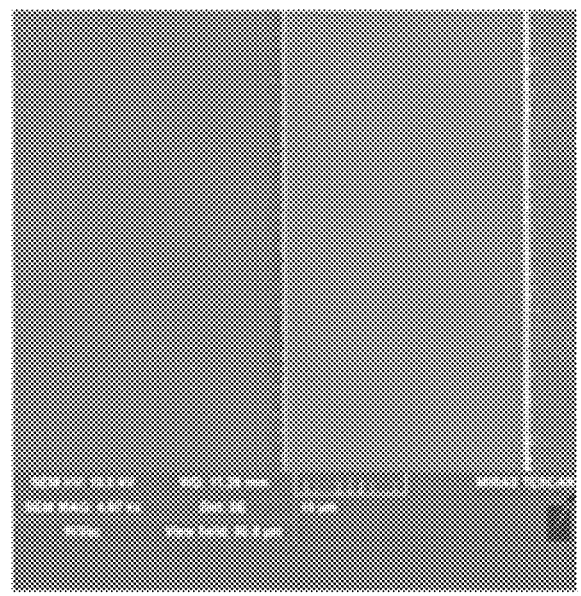
FIG. 7B is an enlarged view of a portion of FIG. 7A.

FIG. 7A is a view showing an SEM planar image representing a conductive pattern formed when a conductive layer is dry-etched in a case where a ratio of a flux of hydrogen ($H_2$) to a flux of a gas is about 0.25. FIG. 7B is an enlarged view of a portion of FIG. 7A. FIGS. 7A and 7B are views showing SEM images representing a conductive pattern formed when a conductive layer is dry-etched through the apparatus 10 for manufacturing a display apparatus of FIG. 2. In FIGS. 7A and 7B, the conductive pattern may include a first layer, a second layer, and a third layer, where the first layer includes ITO, the second layer includes Ag, and the third layer includes ITO.

Referring to FIGS. 7A and 7B, when a ratio of the flux of hydrogen ($H_2$) to the flux of the gas is about 0.25, or the concentration of hydrogen ($H_2$) in the total gas is about 25%, it is shown that, when the conductive layer is etched and the conductive pattern is formed, residual materials are nearly not left.

Figure 8A:
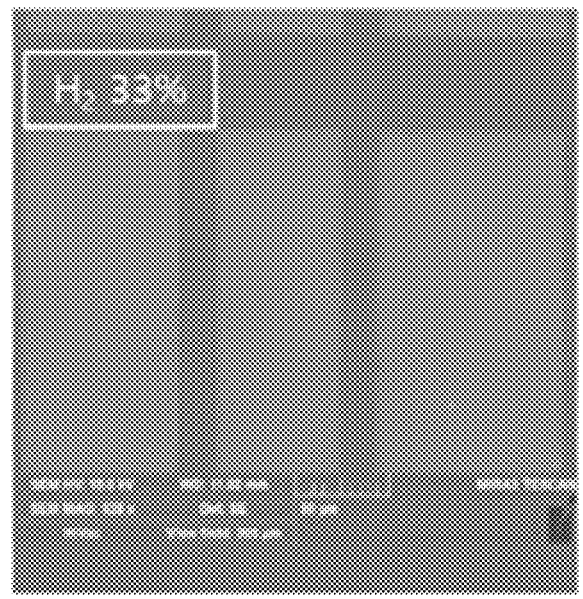
FIG. 8A is a view showing an SEM planar image representing a conductive pattern formed when a conductive layer is dry-etched in a case where a ratio of a flux of hydrogen ($H_2$) to a flux of a gas is about 0.33.
Figure 8B:
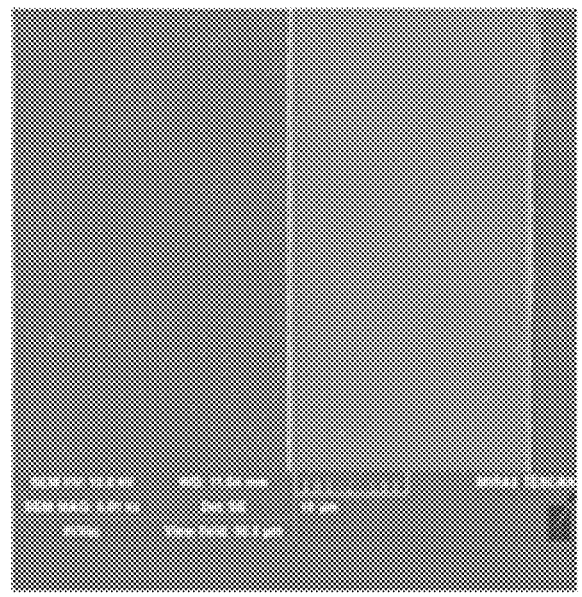
FIG. 8B is an enlarged view of a portion of FIG. 8A.
Figure 8C:
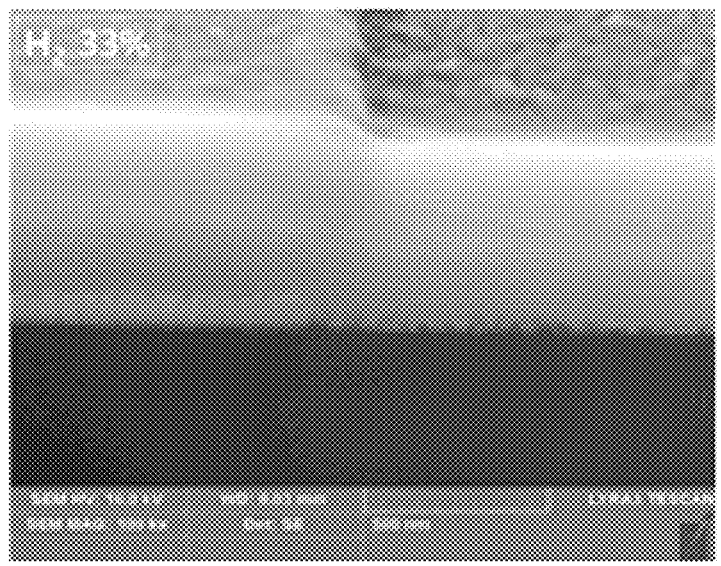
FIG. 8C is a view of an SEM cross-sectional image representing a conductive pattern formed when a conductive layer is dry-etched in a case where a ratio of a flux of hydrogen ($H_2$) to a flux of a gas is about 0.33.

FIG. 8A is a view showing an SEM planar image representing a conductive pattern formed when a conductive layer is dry-etched in a case where a ratio of a flux of hydrogen ($H_2$) to a flux of a gas is about 0.33. FIG. 8B is an enlarged view of a portion of FIG. 8A. FIG. 8C is a view of an SEM cross-sectional image representing a conductive pattern formed when a conductive layer is dry-etched in a case where a ratio of a flux of hydrogen ($H_2$) to a flux of a gas is about 0.33. FIGS. 8A to 8C are views showing an SEM image representing a conductive pattern formed through the apparatus 10 for manufacturing a display apparatus of FIG. 2. In FIGS. 8A to 8C, the conductive pattern may include a first layer, a second layer, and a third layer, where the first layer includes ITO, the second layer includes Ag, and the third layer includes ITO.

Referring to FIGS. 8A to 8C, it shown that, when a ratio of the flux of hydrogen ($H_2$) to the flux of the gas is about 0.33, or the concentration of hydrogen ($H_2$) in the total gas is about 33%, a clean etching profile without residue may be obtained.

Figure 9:
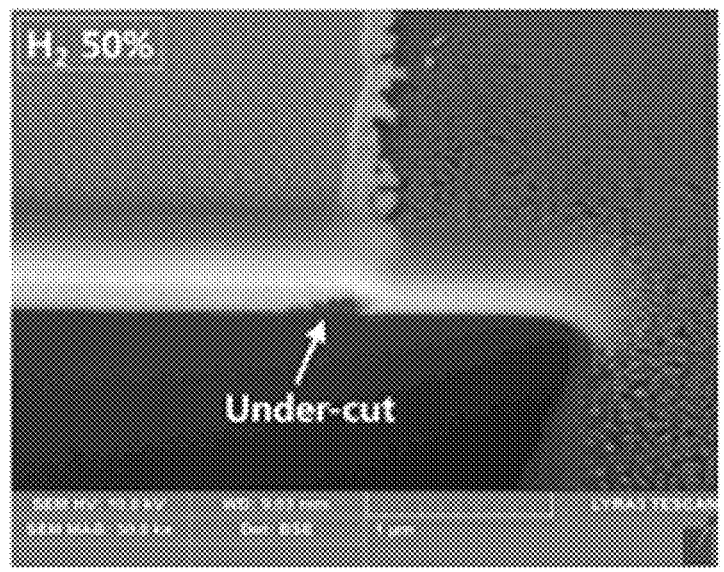
FIG. 9 is a view of an SEM cross-sectional image representing a conductive pattern formed when a conductive layer is dry-etched in a case where a ratio of a flux of hydrogen ($H_2$) to a flux of a gas is about 0.5.

FIG. 9 is a view of an SEM cross-sectional image representing a conductive pattern formed when a conductive layer is dry-etched in a case where a ratio of a flux of hydrogen ($H_2$) to a flux of a gas is about 0.5. FIG. 9 is a view showing an SEM image representing a conductive pattern formed through the apparatus 10 for manufacturing a display apparatus of FIG. 2. In FIG. 9, the conductive pattern may include a first layer, a second layer, and a third layer, where the first layer includes ITO, the second layer includes Ag, and the third layer includes ITO.

Referring to FIG. 9, it is shown that, when a ratio of the flux of hydrogen ($H_2$) to the flux of the gas is about 0.5, or the concentration of hydrogen ($H_2$) in the total gas is about 50%, the conductive pattern has an undercut shape.

Figure 10:
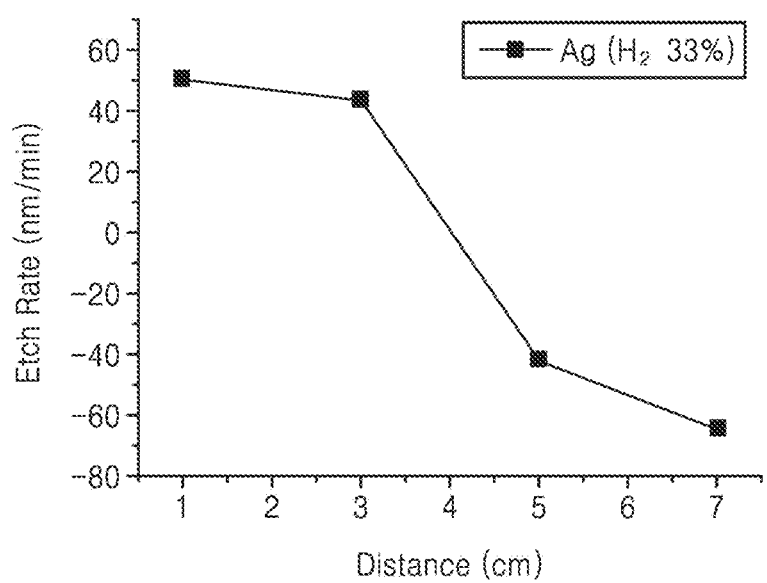
FIG. 10 is a graph showing etch rates according to distances.

FIG. 10 is a graph showing etch rates according to distances. The graph of FIG. 10 shows etch rates of Ag at distances 1 cm, 3 cm, 5 cm, and 7 cm when a flux of hydrogen chloride (HCl) is about 40 sccm, a flux of hydrogen ($H_2$) is about 20 sccm, power of an electron cyclotron resonance plasma generator is about 900 W, and power of the RF generator is about 50 W.

Referring to FIG. 10, it is shown that, as a distance increases, an etch rate of Ag is reduced. Here, the distance may be a separation distance d between the plasma generator 13 and the display substrate S in FIG. 2. If the distance is set to be greater than a preset distance, silver chloride ($AgCl_x$) may grow due to chlorine radicals or chlorine atoms (Cl). In FIG. 10, it is shown that, when a distance is 3 cm, an etch rate of Ag rapidly changes.

Figure 11:
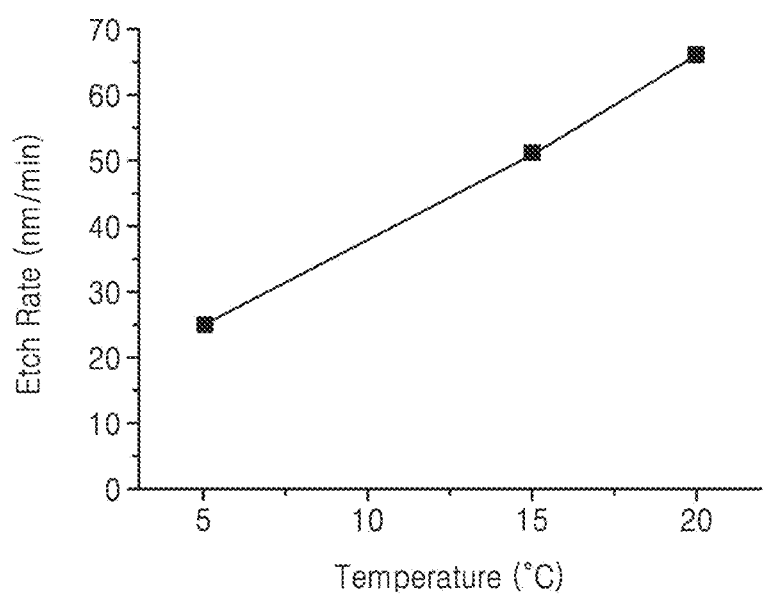
FIG. 11 is a graph showing etch rates according to temperature.

FIG. 11 is a graph showing etch rates according to temperature. The graph of FIG. 11 shows etch rates according to temperature when a flux of hydrogen chloride (HCl) is about 40 sccm, a flux of hydrogen ($H_2$) is about 20 sccm, power of an electron cyclotron resonance plasma generator is about 900 W, power of the RF generator is about 300 W, and a separation distance is 1 cm.

Referring to FIG. 11, it is shown that, as temperature is lowered, an etch rate is reduced. Here, the temperature may be temperature set at a cooler of the susceptor. In addition, it is shown that an etch profile improves at a position at which temperature is low and a cooling efficiency is high.

Figure 12A:
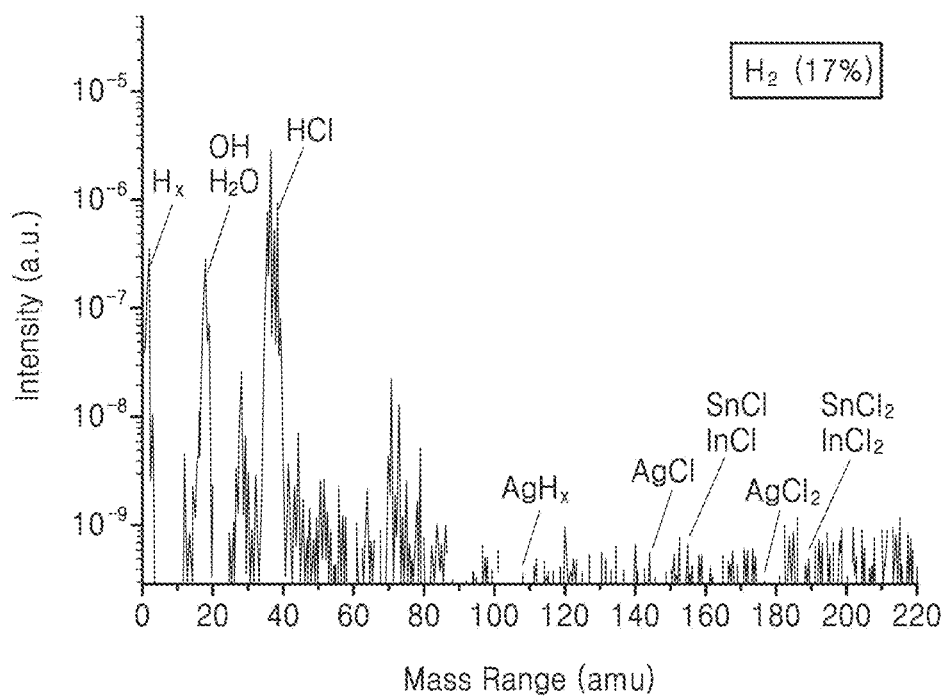
FIG. 12A is a view showing results of measuring products produced through a mass spectrometer when a conductive layer is etched in a case where a ratio of a flux of hydrogen ($H_2$) to a flux of a gas is about 0.17 or the concentration of hydrogen ($H_2$) in a total gas is about 17%.
Figure 12B:
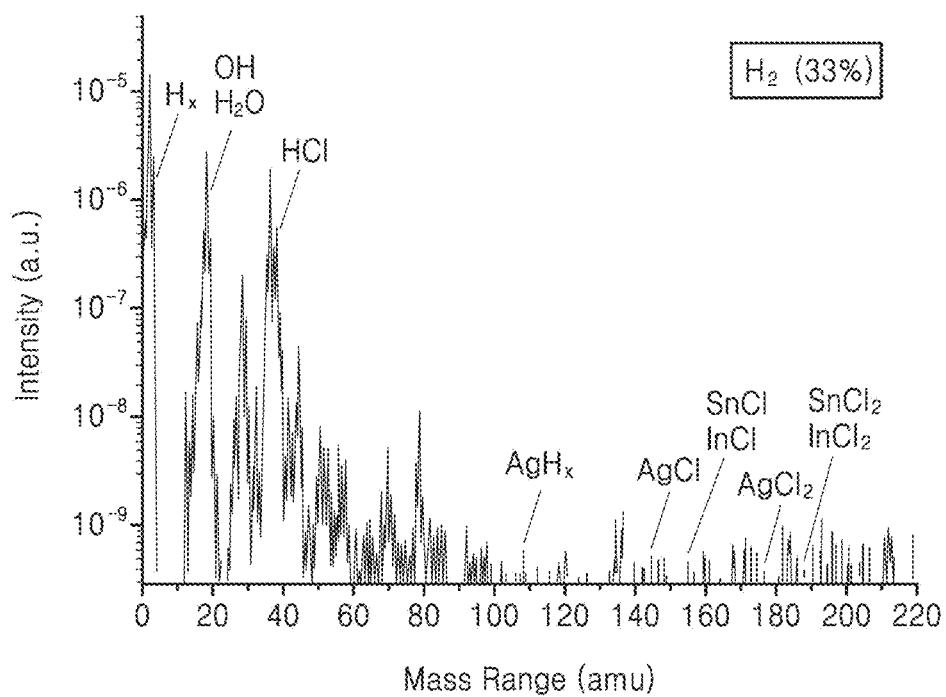
FIG. 12B is a view showing results of measuring products produced through a mass spectrometer when a conductive layer is etched in a case where a ratio of a flux of hydrogen ($H_2$) to a flux of a gas is about 0.33 or the concentration of hydrogen ($H_2$) in a total gas is about 33%.
Figure 12C:
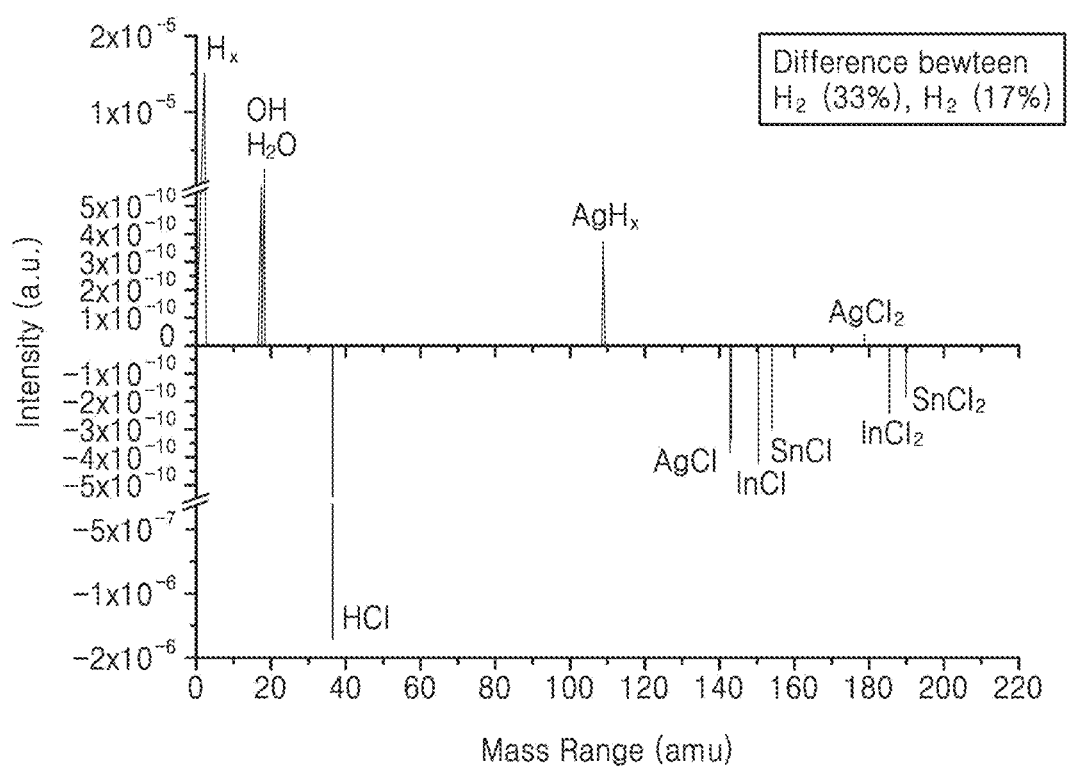
FIG. 12C is a view showing results of differences between FIG. 12B and FIG. 12A.

FIG. 12A is a view showing results of measuring products produced through a mass spectrometer when a conductive layer is etched in a case where a ratio of a flux of hydrogen ($H_2$) to a flux of a gas is about 0.17 or the concentration of hydrogen ($H_2$) in a total gas is about 17%. FIG. 12B is a view showing results of measuring products produced through a mass spectrometer when a conductive layer is etched in a case where a ratio of a flux of hydrogen ($H_2$) to a flux of the gas is about 0.33 or the concentration of hydrogen ($H_2$) in a total gas is about 33%. FIG. 12C is a view showing results of differences between FIG. 12B and FIG. 12A. Products during an etching process have been measured by using a quality management system ("QMS") as the mass spectrometer. In FIGS. 12A to 12C, the conductive layer includes a first layer, a second layer, and a third layer, where the first layer includes ITO, the second layer includes Ag, and the third layer includes ITO.

Referring to FIGS. 12A to 12C, it is shown that, as a ratio of a flux of hydrogen ($H_2$) to a flux of the gas increases, a ratio of hydride compounds increases and a ratio of halide compounds is reduced. In FIGS. 12A to 12C, it is shown that, as a ratio of a flux of hydrogen ($H_2$) to a flux of the gas increases, more volatile products are formed. As more volatile products are formed, a contamination degree of the chamber may be reduced. In addition, it may be shown that, when the conductive layer is etched, silver hydride ($AgH_x$) may be formed.

Figure 13A:
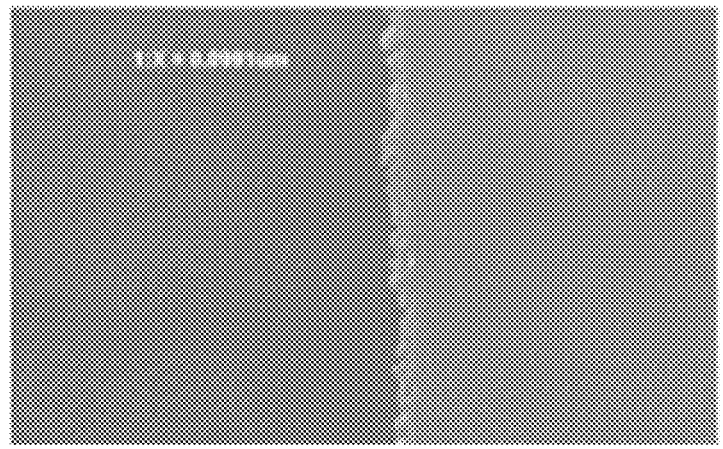
FIG. 13A is a view showing an SEM planar image representing a conductive pattern formed when a conductive layer is wet-etched according to a comparative example.
Figure 13B:
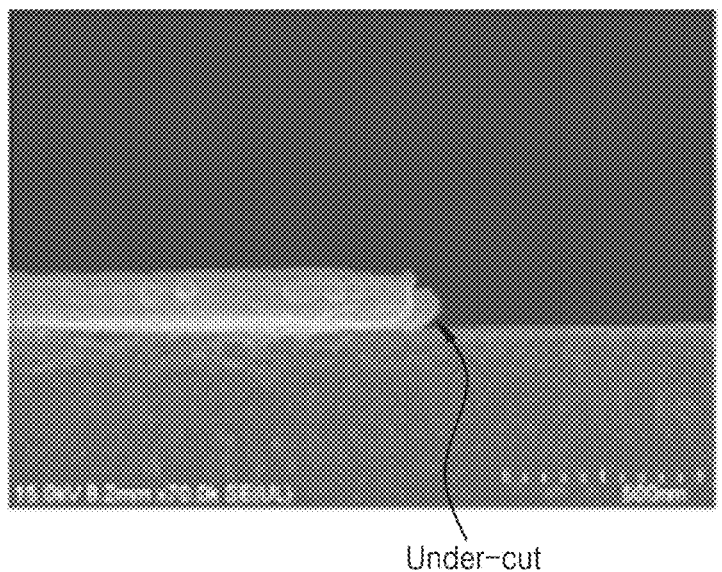
FIG. 13B is a view showing an SEM cross-sectional image representing a conductive pattern formed when a conductive layer is wet-etched according to a comparative example.

FIG. 13A is a view showing an SEM planar image representing a conductive pattern formed when a conductive layer is wet-etched according to a comparative example. FIG. 13B is a view showing an SEM cross-sectional image representing a conductive pattern formed when a conductive layer is wet-etched according to a comparative example. In FIGS. 13A and 13B, the conductive pattern includes a first layer, a second layer, and a third layer, where the first layer includes ITO, the second layer includes Ag, and the third layer includes ITO. Etching solution may include at least one selected from acetic acid ($CH_3COOH$), nitric acid ($HNO_3$), and phosphoric acid ($H_3PO_4$).

Referring to FIGS. 13A and 13B, it is shown that the lateral surface of the conductive pattern formed when the conductive layer is wet-etched has a rough shape. That is, the lateral surface of the conductive pattern may have poor flatness. In addition, it is shown that, in the conductive pattern formed when the conductive layer is wet-etched, the lateral surface of the conductive pattern defining the edge portion of the conductive pattern has a round shape. In this case, because the lateral surface of the conductive pattern has an undercut shape, the reliability of the display apparatus including the conductive pattern formed when the conductive layer is wet-etched may be reduced. In contrast, according to an embodiment of the invention, as described above, because the conductive pattern is formed by dry-etching the conductive layer, the reliability of the display apparatus may be increased.

Figure 14A:
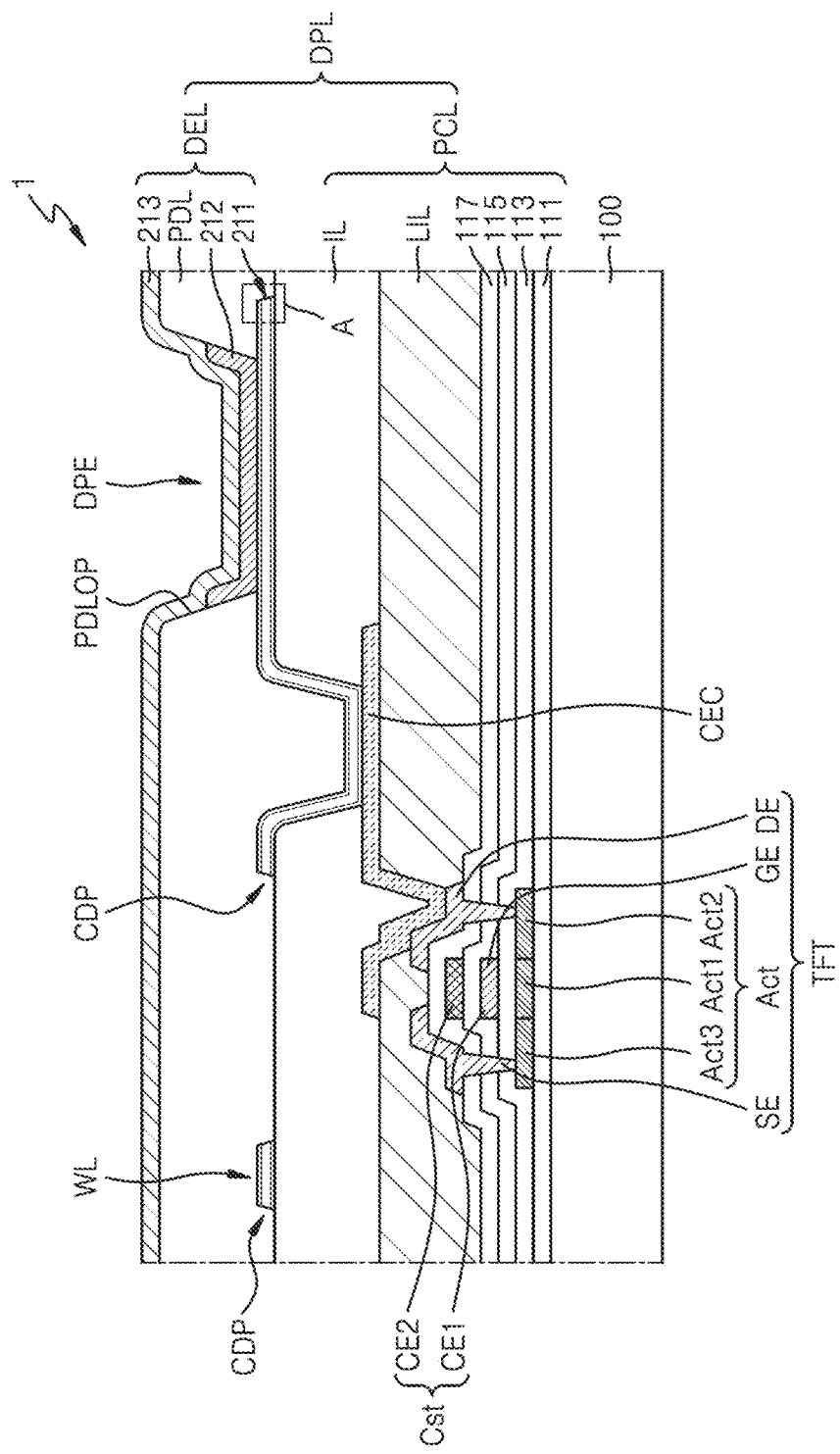
FIG. 14A is a cross-sectional view of a display apparatus according to an embodiment.
Figure 14B:
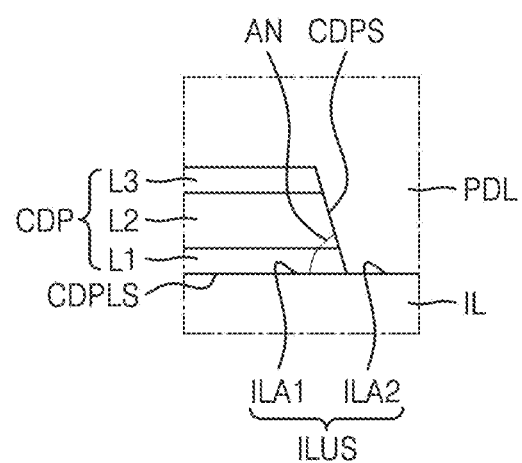
FIG. 14B is an enlarged view of a region A of the display apparatus of FIG. 14A.

FIG. 14A is a cross-sectional view of a display apparatus 1 according to an embodiment. FIG. 14B is an enlarged view of a region A of the display apparatus 1 of FIG. 14A.

Referring to FIGS. 14A and 14B, an embodiment of the display apparatus 1 may include the substrate 100 and a display layer DPL disposed on the substrate 100. The display layer DPL may include a pixel circuit layer PCL and a display element layer DEL. In an embodiment, the display apparatus 1 may include the conductive pattern CDP.

The pixel circuit layer PCL may be disposed on the substrate 100. The pixel circuit layer PCL may include a thin-film transistor TFT, a storage capacitor Cst, a buffer layer 111, a first gate insulating layer 113, a second gate insulating layer 115, an interlayer insulating layer 117, a lower insulating layer LIL, a connection electrode CEC, and an insulating layer IL.

The buffer layer 111 may be disposed on the substrate 100. The buffer layer 111 may include an inorganic insulating material such as silicon nitride (SiN$_x$), silicon oxynitride (SiON), and silicon oxide (SiO$_2$) and have a single layer structure or a multi-layer structure, each layer therein including at least one selected from the above inorganic insulating material.

The thin-film transistor TFT may include a semiconductor layer Act, a gate electrode GE, a drain electrode DE, and a source electrode SE. The semiconductor layer Act may be disposed on the buffer layer 111. In an embodiment, the semiconductor layer Act may include polycrystalline silicon. Alternatively, the semiconductor layer Act may include amorphous silicon, an oxide semiconductor, or an organic semiconductor. The semiconductor layer Act may include a channel region Act1, a drain region Act2 and a source region Act3, and the drain region Act2 and the source region Act3 may be respectively disposed at two opposite sides of the channel region Act1.

A gate electrode GE may overlap the channel region Act1. The gate electrode GE may include a low-resistance metal material. The gate electrode GE may include a conductive material including molybdenum (Mo), aluminum (Al), copper (Cu), and titanium (Ti) and have a single-layered structure or a multi-layered structure, each layer therein including at least one selected from the above materials.

The first gate insulating layer 113 may be disposed between the gate electrode GE and the semiconductor layer Act. The first gate insulating layer 113 may include an inorganic insulating material including silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO).

The second gate insulating layer 115 may be disposed on the first gate insulating layer 113 to cover the gate electrode GE. The second gate insulating layer 115 may be disposed on the gate electrode GE and the first gate insulating layer 113. Similar to the first gate insulating layer 113, the second gate insulating layer 115 may include an inorganic insulating material including silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO).

An upper electrode CE2 of the storage capacitor Cst may be disposed on the second gate insulating layer 115. In an embodiment, the upper electrode CE2 may overlap the gate electrode GE therebelow. The gate electrode GE and the upper electrode CE2 overlapping each other with the second gate insulating layer 115 therebetween may constitute the storage capacitor Cst. In such an embodiment, the gate electrode GE may serve as a lower electrode CE1 of the storage capacitor Cst.

In an embodiment, as described above, the storage capacitor Cst may overlap the thin-film transistor TFT. In an alternative embodiment, the storage capacitor Cst may not overlap the thin-film transistor TFT.

The upper electrode CE2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) and have a single layer structure or a multi-layer structure, each layer therein including at least one selected from the above materials.

The interlayer insulating layer 117 may be disposed on the second gate insulating layer 115 to cover the upper electrode CE2. The interlayer insulating layer 117 may be disposed on the upper electrode CE2 and the second gate insulating layer 115. The interlayer insulating layer 117 may include silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO). The interlayer insulating layer 117 may have a single layer structure or a multi-layer structure, each layer therein including at least one selected from the above inorganic insulating materials.

The drain electrode DE and the source electrode SE may be disposed on the interlayer insulating layer 117. The drain electrode DE may be electrically connected to the drain region Act2 through a contact hole defined in the first gate insulating layer 113, the second gate insulating layer 115 and the interlayer insulating layer 117. The source electrode SE may be electrically connected to the source region Act3 through a contact hole defined in the first gate insulating layer 113, the second gate insulating layer 115 and the interlayer insulating layer 117. The drain electrode DE and the source electrode SE may include a conductive material including molybdenum (Mo), aluminum (Al), copper (Cu) or titanium (Ti) and have a single-layered structure or a multi-layered structure, each layer therein including at least one selected from the above materials. In an embodiment, the drain electrode DE and the source electrode SE may have a multi-layered structure of Ti/Al/Ti.

The lower insulating layer LIL may be disposed on the thin-film transistor TFT and the interlayer insulating layer 117. The lower insulating layer LIL may cover the thin-film transistor TFT and the interlayer insulating layer 117. The lower insulating layer LIL may include an organic insulating material including a general-purpose polymer such as polymethylmethacrylate ("PMMA") or polystyrene ("PS"), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

A connection electrode CEC may be disposed on the lower insulating layer LIL. The connection electrode CEC may be connected to the source electrode SE or the drain electrode DE through a contact hole defined in the lower insulating layer LIL. In an alternative embodiment, the lower insulating layer LIL and the connection electrode CEC may be omitted.

The insulating layer IL may be disposed on the lower insulating layer LIL. In an embodiment, the insulating layer IL may cover at least a portion of the connection electrode CEC. In an embodiment, the insulating layer IL may be disposed on the substrate 100. The thin-film transistor TFT may be disposed between the substrate 100 and the insulating layer IL. In an embodiment, the insulating layer IL may include an organic insulating material including a general-purpose polymer such as PMMA or PS, polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

The conductive pattern CDP may be disposed on the insulating layer IL. In an embodiment, the conductive pattern CDP may be disposed directly on the insulating layer IL. In such an embodiment where the conductive pattern CDP is disposed directly on the insulating layer IL, no element is arranged between the conductive pattern CDP and the insulating layer IL.

In an embodiment, the conductive pattern CDP may include a first layer L1 and a second layer L2. In an embodiment, the conductive pattern CDP may include the first layer L1, the second layer L2, and the third layer L3.

The first layer L1 may include at least one selected from indium (In), stannum (Sn), and oxygen (O). In an embodiment, the first layer L1 may include ITO. In an embodiment, the first layer L1 may include a conductive oxide. The first layer L1 may include at least one selected from ITO, IZO, zinc oxide (ZnO), indium oxide ($In_2O_3$), IGO, and AZO. The second layer L2 may be disposed on the first layer L1. The second layer L2 may include Ag. The third layer L3 may be disposed on the second layer L2. The third layer L3 may include at least one selected from indium (In), stannum (Sn), and oxygen (O). In an embodiment, the third layer L3 may include ITO. In an embodiment, the third layer L3 may include a conductive oxide. The third layer L3 may include at least one selected from ITO, IZO, zinc oxide (ZnO), indium oxide ($In_2O_3$), IGO, and AZO.

The lateral surface CDPS of the conductive pattern CDP may define the edge portion of the conductive pattern CDP. The lateral surface CDPS of the conductive pattern CDP may be connected to the lower surface CDPLS of the conductive pattern CDP facing the upper surface ILUS of the insulating layer IL. The lateral surface CDPS of the conductive pattern CDP may be a surface formed when the conductive pattern is formed while the conductive layer is etched.

In an embodiment, the lateral surface CDPS of the conductive pattern CDP may include silver chloride ($AgCl_x$). In one embodiment, for example, because the conductive layer is dry-etched while the conductive pattern CDP is formed, the lateral surface CDPS of the conductive pattern CDP may include silver chloride ($AgCl_x$). In such an embodiment where the conductive layer is dry-etched, the shape of the conductive pattern CDP may be more precisely controlled than the case where the conductive layer is wet-etched.

An angle AN between the lower surface CDPLS of the conductive pattern CDP and the lateral surface CDPS of the conductive pattern CDP may be one of an acute angle and a right angle. If the angle AN between the lower surface CDPLS of the conductive pattern CDP and the lateral surface CDPS of the conductive pattern CDP is an obtuse angle, the lateral surface CDPS of the conductive pattern CDP may have an undercut shape. In this case, the reliability of the display apparatus may be reduced. In an embodiment, as described above, the conductive layer is dry-etched while the conductive pattern CDP is formed, such that the angle AN between the lower surface CDPLS of the conductive pattern CDP and the lateral surface CDPS of the conductive pattern CDP may be one of an acute angle and a right angle. Accordingly, the reliability of the display apparatus may improve.

In an embodiment, as described above, each of the first layer L1 and the second layer L2 may be a dry-etched layer. In an embodiment, each of the first layer L1, the second layer L2, and the third layer L3 may be a dry-etched layer. A gas used for dry-etching the first layer L1, the second layer L2, and the third layer L3 may include hydrogen ($H_2$) and hydrogen chloride (HCl). In an embodiment, a ratio of a flux of hydrogen ($H_2$) to a flux of the gas may be about 0.17 or greater. In an embodiment, a ratio of a flux of hydrogen ($H_2$) to a flux of the gas may be about 0.5 or less. In an embodiment, a ratio of a flux of hydrogen ($H_2$) to a flux of the gas may be in a range of about 0.17 to about 0.5.

The upper surface ILUS of the insulating layer IL may include the first area ILA1 and the second area ILA2. The first area ILA1 may overlap the conductive pattern CDP. The second area ILA2 may extend from the first area ILA1. The second area ILA2 may not overlap the conductive pattern CDP. In an embodiment, the second area ILA2 may a region through which the conductive layer CDL is etched and exposed while the conductive pattern CDP is formed.

In an embodiment, the second area ILA2 of the insulating layer IL may include a chlorine component ($Cl_x$). In such an embodiment, the upper surface ILUS in the second area ILA2 of the insulating layer IL may include a compound including chlorine component ($Cl_x$). In such an embodiment, the conductive pattern CDP is formed through a dry-etching process.

The display element layer DEL may be disposed on the pixel circuit layer PCL. The display element layer DEL may include a display element DPE. In an embodiment, the display element DPE may be an organic light-emitting diode including an organic emission layer. Alternatively, the display element DPE may be a light-emitting diode LED. The size of the light-emitting diode LED may be micro scale or nano scale. In one embodiment, for example, the light-emitting diode may be a micro light-emitting diode. Alternatively, the light-emitting diode may be a nanorod light-emitting diode. The nanorod light-emitting diode may include gallium nitride (GaN). In such an embodiment, a color-converting layer may be disposed on the nanorod light-emitting diode. The color-converting layer may include quantum dots. Alternatively, the display element DPE may be a quantum-dot light-emitting diode including a quantum-dot emission layer. Alternatively, the display element DPE may be an inorganic light-emitting diode including an inorganic semiconductor. Hereinafter, for convenience of description, embodiments where the display element DPE is an organic light-emitting diode will be mainly described.

The display element DPE may include a pixel electrode 211, an emission layer 212, and an opposite electrode 213. The pixel electrode 211 may be disposed on the insulating layer IL. In an embodiment, the pixel electrode 211 may be connected to the connection electrode CEC through a hole defined in the insulating layer IL. In an embodiment, the conductive pattern CDP may be the pixel electrode 211. In an embodiment, the thin-film transistor TFT may be electrically connected to the conductive pattern CDP.

A pixel-defining layer PDL may cover the edges of the pixel electrode 211. The pixel-defining layer PDL may include an organic insulating material and/or an inorganic insulating material. In an embodiment, an opening PDLOP may be defined through the pixel-defining layer PDL to expose the pixel electrode 211.

The emission layer 212 may be disposed on the pixel electrode 211. In an embodiment, the emission layer 212 may be disposed on the conductive pattern CDP. The emission layer 212 may overlap the opening PDLOP of the pixel-defining layer PDL. The emission layer 212 may include a polymer organic material or a low-molecular weight organic material that emits light of a preset color.

The opposite electrode 213 may be disposed on the emission layer 212. The opposite electrode 213 may be disposed on the emission layer 212 and the pixel-defining layer PDL. The opposite electrode 213 may include a conductive material having a small work function. In one embodiment, for example, the opposite electrode 213 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. Alternatively, the opposite electrode 213 may further include a layer on the (semi) transparent layer, where the layer includes ITO, IZO, ZnO, or $In_2O_3$. In an embodiment, at least one selected from a hole transport layer ("HTL") and a hole injection layer ("HIL") may be further provided between the pixel electrode 211 and the emission layer 212. In an embodiment, at least one selected from an electron transport layer ("ETL") and an electron injection layer ("EIL") may be further provided between the emission layer 212 and the opposite electrode 213.

In an alternative embodiment, the conductive pattern CDP may be a wiring WL. In an embodiment, the wiring WL may be disposed in a same layer as the pixel electrode 211. Alternatively, the wiring WL may be disposed in a layer different from the pixel electrode 211. In such an embodiment, as described above, the conductive layer is dry-etched while the conductive pattern CDP is formed, a precise wiring WL may be implemented.

In embodiments of the invention, as described above, the display apparatus may include the conductive pattern including the first layer and the second layer, where the first layer includes at least one selected from indium (In), stannum (Sn), and oxygen (O), the second layer includes silver (Ag), and the lateral surface of the conductive pattern includes silver chloride ($AgCl_x$). Accordingly, in such embodiments of the display apparatus, the conductive pattern may be precisely patterned on the insulating layer and a high reliability may be achieved.

In addition, in embodiments of the method of manufacturing a display apparatus according to the invention, a display apparatus may be manufactured through a simplified and highly-reliable dry-etching process that uses a gas including hydrogen and hydrogen chloride.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display apparatus comprising:
an insulating layer; and
a conductive pattern disposed on the insulating layer, wherein the conductive pattern includes a first layer and a second layer, the first layer includes at least one selected from indium tin oxide, indium zinc oxide, indium oxide, indium gallium oxide, and aluminum zinc oxide, and the second layer includes silver (Ag),
wherein a lateral surface of the conductive pattern defining an edge portion of the conductive pattern includes silver chloride ($AgCl_x$) and
wherein at least one selected from a pixel electrode and a wiring of the display apparatus is defined by the conductive pattern.

2. The display apparatus of claim 1, wherein
an upper surface of the insulating layer includes a first region and a second region,
the first region overlaps the conductive pattern,
the second region extends from the first region, and
the insulating layer includes a chlorine component ($Cl_x$) in the second region.

3. The display apparatus of claim 2, wherein the conductive pattern is disposed directly on the insulating layer.

4. The display apparatus of claim 1, wherein each of the first layer and the second layer is a dry-etched layer.

5. The display apparatus of claim 4, wherein
the conductive pattern includes a lower surface which faces an upper surface of the insulating layer, and
an angle between the lower surface of the conductive pattern and a lateral surface of the conductive pattern is one of an acute angle and a right angle.

6. The display apparatus of claim 1, wherein the first layer includes indium tin oxide.

7. The display apparatus of claim 1, further comprising:
a substrate disposed below the conductive pattern; and
a thin-film transistor disposed between the substrate and the insulating layer, wherein the thin-film transistor is electrically connected to the conductive pattern.

8. The display apparatus of claim 1, wherein the conductive pattern includes a wiring.

9. A display apparatus comprising:
an insulating layer; and
a conductive pattern disposed on the insulating layer, wherein the conductive pattern includes a first layer and a second layer, the first layer includes at least one selected from indium (In), stannum (Sn) and oxygen (O), and the second layer includes silver (Ag),
wherein a lateral surface of the conductive pattern defining an edge portion of the conductive pattern includes silver chloride ($AgCl_x$),
the conductive pattern further includes a third layer including at least one selected from indium (In), stannum (Sn) and oxygen (O), and
the first layer, the second layer and the third layer are sequentially stacked one on another.

10. A display apparatus comprising:
an insulating layer;
a conductive pattern disposed on the insulating layer, wherein the conductive pattern includes a first layer and a second layer, the first layer includes at least one selected from indium (In), stannum (Sn) and oxygen (O), and the second layer includes silver (Ag);
an emission layer disposed on the conductive pattern; and
an opposite electrode disposed on the emission layer,
wherein a lateral surface of the conductive pattern defining an edge portion of the conductive pattern includes silver chloride ($AgCl_x$), and
the conductive pattern includes a pixel electrode.

11. A method of manufacturing a display apparatus, the method comprising:
providing a display substrate inside a chamber, wherein the display substrate includes an insulating layer and a conductive layer on the insulating layer, the conductive layer includes a first layer and a second layer, the first layer includes at least one selected from indium (In), stannum (Sn) and oxygen (O), and the second layer includes silver (Ag);
supplying a gas into the chamber, wherein the gas includes hydrogen and hydrogen chloride; and
etching the conductive layer by allowing the conductive layer to react with the gas.

12. The method of claim 11, wherein a ratio of a flux of the hydrogen to a flux of the gas is in a range of about 0.17 to about 0.5.

13. The method of claim 11, wherein
the chamber is connected to a plasma generator,
the etching the conductive layer comprises using plasma formed by the plasma generator,
the plasma generator includes an electron cyclotron resonance plasma generator, and the display substrate is apart from the plasma generator by a distance greater than 0 cm and less than or equal to about 3 cm.

14. The method of claim 11, wherein the conductive layer is etched with reactive ions.

15. The method of claim 11, wherein the etching the conductive layer includes forming silver hydride ($AgH_x$).

16. The method of claim 11, wherein
the conductive layer further includes a third layer including at least one selected from indium (In), stannum (Sn) and oxygen (O),
the first layer, the second and the third layer are sequentially stacked one on another, and
the first layer, the second layer and the third layer are etched during a same process.

17. The method of claim 11, further comprising:
spectroscopically analyzing a material inside the chamber,
wherein the etching the conductive layer is terminated based on a result from the spectroscopically analyzing the material inside the chamber.

18. The method of claim 11, further comprising:
providing a mask on the conductive layer, wherein a mask opening is defined in the mask.

19. The method of claim 11, further comprising:
maintaining a temperature of the display substrate in a range of about 5° C. to about 100° C.

\* \* \* \* \*